United States Patent [19]

Thomas

[11] Patent Number: 5,317,141
[45] Date of Patent: May 31, 1994

[54] APPARATUS AND METHOD FOR HIGH-ACCURACY ALIGNMENT

[75] Inventor: Michael E. Thomas, Milpitas, Calif.

[73] Assignee: National Semiconductor Corporation, Santa Clara, Calif.

[21] Appl. No.: 929,826

[22] Filed: Aug. 14, 1992

[51] Int. Cl.⁵ .................................................. G21K 5/10
[52] U.S. Cl. .................................... 250/491.1; 250/306
[58] Field of Search .............................. 250/491.1, 306

[56] References Cited

U.S. PATENT DOCUMENTS

| | | | |
|---|---|---|---|
| 4,785,187 | 11/1988 | Kariya et al. | 250/491.1 |
| 4,912,822 | 4/1990 | Zdeblick et al. | 250/306 |
| 5,150,392 | 9/1992 | Hohn et al. | 250/491.1 |

OTHER PUBLICATIONS

Hansma, et al., Scanning Tunneling Microscopy and Atomic Force Microscopy Application to Biology and Technology, Science, vol. 242, Oct. 14, 1989, p. 209.
Albrecht, et al., Atomic Resolution with the Atomic Force Microscope on Conductors and Semiconductors, Journal of Vacuum Science & Technology A6:271 (Mar./Apr. 1988).
Heinzelmann, et al., Atomic Force Microscopy: General Aspects and Application to Insulators, Journal of Vacuum Science & Technology A 6:275 (Mar./Apr. 1988).

*Primary Examiner*—Jack I. Berman
*Attorney, Agent, or Firm*—H. Donald Nelson; Stephen R. Robinson; William H. Murray

[57] ABSTRACT

A method of alignment of a first object with a second object includes the steps of determining the location of a feature on a surface of the second object using a probe of a scanned probe microscope, and positioning the first object in preselected spatial relationship with respect to the located feature. In an apparatus for performing lithography on a substrate, having a mask and a mask holder supporting the mask, an improvement includes an apparatus having a probe of a scanned probe microscope, for determining the location of a feature on a surface of the substrate. A method of forming a probe of a scanned probe microscope on a substrate includes the steps of providing a conductive base, having a tungsten surface layer, on the substrate, providing a dielectric layer and a high-temperature polymeric layer on the conductive base; opening a hole through the dielectric layer and the organic compound layer to the tungsten surface layer of the base, and selectively depositing tungsten by chemical vapor deposition on the tungsten surface in the hole to form a substantially conical tungsten tip in the hole.

28 Claims, 20 Drawing Sheets

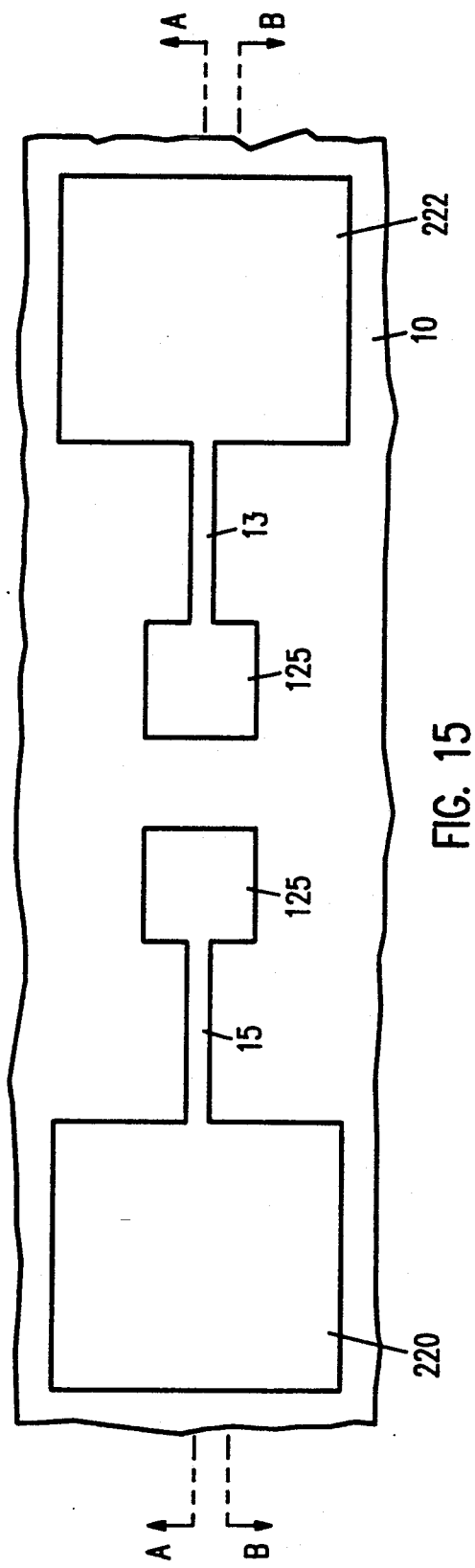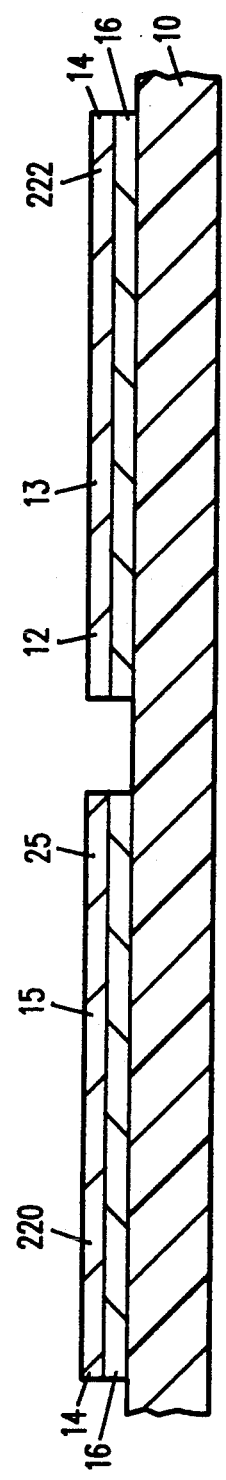
FIG. 15
FIG. 15A

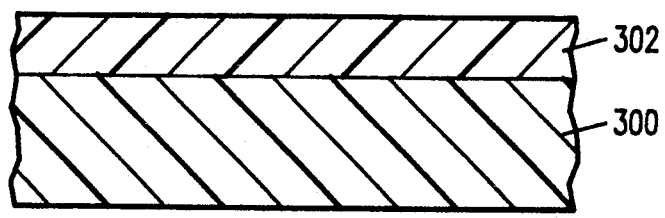
FIG. 22
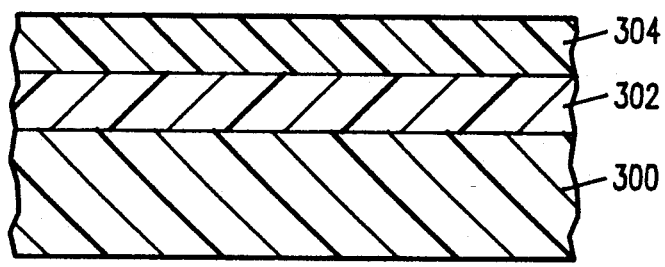
FIG. 23
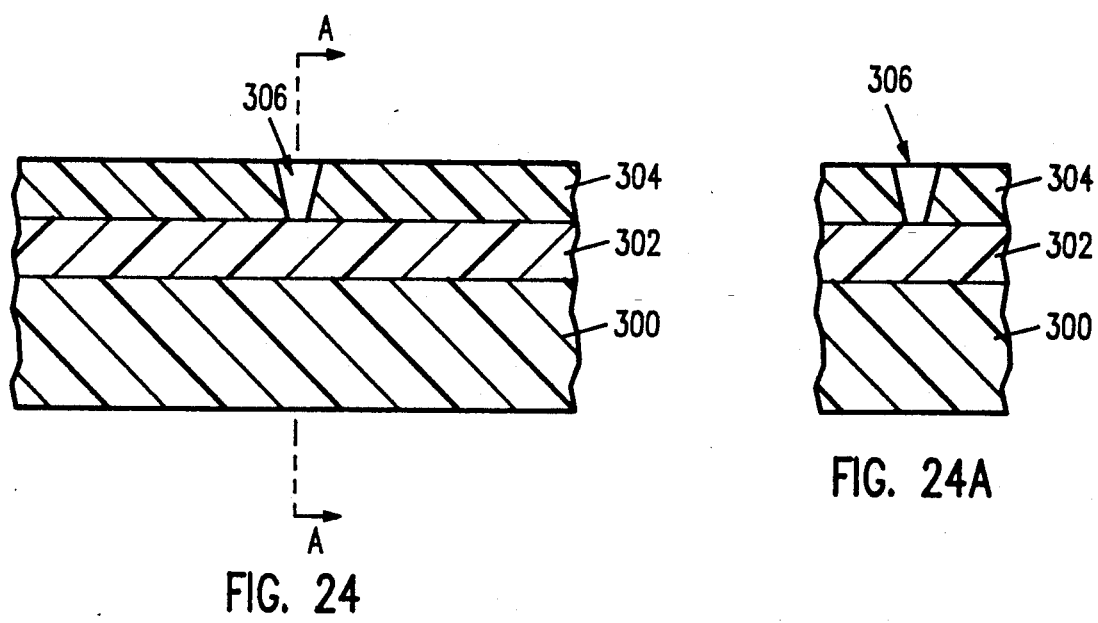
FIG. 24
FIG. 24A

APPARATUS AND METHOD FOR HIGH-ACCURACY ALIGNMENT

BACKGROUND OF THE INVENTION

This invention relates to methods and apparatuses for alignment of objects, and relates in particular to alignment techniques for use in lithography in the manufacture of semiconductor devices.

In the manufacture of semiconductor devices, a large number of patterning steps are carried out in the formation of complex, multi-layer structures. Each patterning step is carried out through lithographic techniques, involving exposure of selected portions of a resist to particles or light. In the fabrication of such multi-layer structures, it is extremely important that each pattern layer be aligned or in registration with, other layers in the structure. Mistakes in alignment or registration will result in unusable structures.

Conventionally, registration is accomplished by optically locating alignment marks on the surface of a wafer. For example, a low energy laser beam may be projected on such an alignment mark on the wafer surface. Analysis of the reflected image then indicates the position of the lithographic system with respect to the alignment mark. The accuracy of optical alignment techniques is limited due to the limited resolution of light beams.

Objects of the invention will become evident from the detailed description of a preferred embodiment which follows.

SUMMARY OF THE INVENTION

A method for alignment of a first object with a second object comprises the steps of determining the location of a feature on a surface of the second object using a probe of a scanned probe microscope, and positioning the first object in preselected spatial relationship with respect to the located feature.

In an apparatus for performing lithography on a substrate, having a mask and mask holder supporting the mask, the improvement comprising means, comprising a probe of a scanned probe microscope, for determining the location of a feature on a surface of the substrate.

A method of forming a probe of a scanned probe microscope on a substrate includes the steps of providing a first conductive base, having a tungsten surface layer, on the substrate; providing a dielectric layer and a layer comprising an organic compound on the first conductive base; opening a hole through the dielectric layer and the organic compound layer; and selectively depositing tungsten on the tungsten surface in the hole, whereby a probe having a substantially conical tip is formed in the hole.

A method of forming a probe of an atomic force microscope includes the steps of forming a release layer on a substrate, forming a first metal layer on the release layer, forming a dielectric layer on the first metal layer, forming a second metal layer on the dielectric layer, providing a probe tip projecting from at least one of the first and second metal layers, providing a structure for maintaining the first and second metal layers at a predetermined separation, and removing the dielectric layer and the release layer.

BRIEF DESCRIPTION OF THE FIGURES

FIG. 15 is a top view of a patterned structure formed in an initial step in a process according to the invention of fabrication of an AFM probe.

FIG. 15A is sectional view taken along line A—A of FIG. 15.

FIG. 22 is a cross-sectional view of a substrate after the step of forming a release layer according to an alternate embodiment of a method of the invention.

FIG. 23 is a cross-sectional view, similar to FIG. 22, after the step of forming of a dielectric layer.

FIG. 24 is a cross-sectional view, similar to FIG. 25, after the step of forming of an opening in the dielectric layer, and FIG. 24A is a cross-sectional view taken along line A—A of FIG. 24.

DETAILED DESCRIPTION OF A PREFERRED EMBODIMENT

Figure 1A:
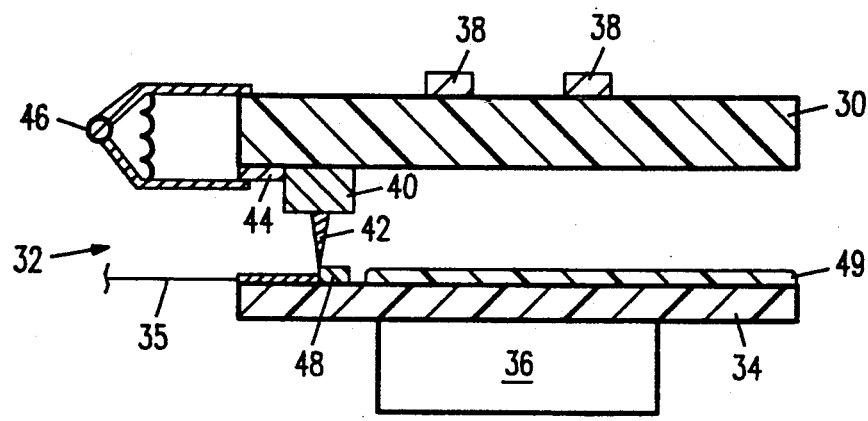
FIGS. 1A and 1B are sectional views showing two embodiments of an apparatus according to the invention.
Figure 1B:
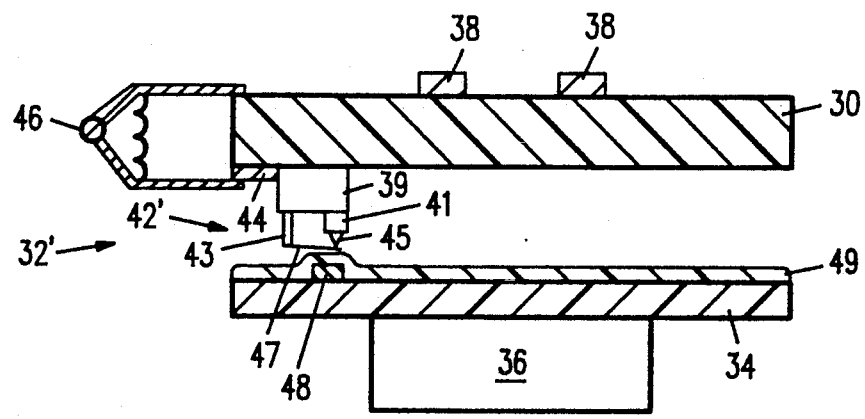

FIGS. 1A and 1B are sectional views showing an apparatus according to the invention for use in semiconductor device fabrication, specifically in X-ray lithography for aligning an X-ray mask to a semiconductor wafer. An X-ray mask 30 is shown. X-ray mask 30 is conventionally a silicon nitride membrane. Means 32 for locating a feature on a surface of an object, specifically on a surface of a wafer, is mounted on and depends from a forward face of mask 30. A wafer 34 is shown mounted facing the forward face of mask 30. Wafer 34 is held in place on wafer chuck or mount 36.

Mask 30 is provided with opaque patterned features, indicated at 38, as is conventional. In operation, X-rays are projected through mask 30 onto wafer 34. Patterning 38 blocks X-rays and thereby a pattern is projected onto wafer 34.

With specific reference to FIG. 1A, means 32 for locating a feature on a wafer includes conductive pad 40, probe 42, and conductive line 44. Conductive pad 40 is provided on the forward face of mask 30 near an edge thereof. Conductive pad 40 is conventionally of chrome or tungsten, for example. Probe 42 is provided on a lower face of conductive pad 40. Probe 40 is a probe of a scanned probe microscope. A scanned probe microscope, as that term is used herein, includes all microscopes that operate by scanning a fine-tipped probe over the surface of an object and, by directly or indirectly monitoring interactions between the probe and the surface, to determine characteristics or properties of the surface. Such properties include, for example, topographic features and conductivity. Probe 42 of the embodiment of the invention depicted in FIG. 1A is a probe of a scanning tunneling microscope ("STM"). An STM operates by applying a voltage difference between the probe and the object surface sufficient to produce a tunneling current.

Conductive line 44 is provided on the forward face of mask 30. Conductive line 44 is in electrical contact with conductive pad 40. Conductive line 44 extends to an edge of mask 30. A clip 46 is placed on mask 30 in contact with conductive line 44. Clip 46 is connected to appropriate conventional STM circuitry (not shown). Alternative electrical means may be provided for establishing a voltage differential between probe 42 and the wafer surface.

Wafer 34 has provided thereon alignment mark 48. Alignment mark 48 as shown in FIG. 1 is a raised feature on the surface of the wafer 34. Alignment mark 48 may also be a valley or cut in the surface of wafer 34. In using an STM, it is essential to provide a conductive wafer surface, so that a voltage differential can be created between the probe 42 and the surface of wafer 48. A structure must be provided to achieve electrical contact between the surface of wafer 34 and the STM circuitry. For example, a conductive line 35, electrically connected to alignment mark 48 by an extension thereof on the surface of wafer 34, must be provided between the wafer and STM circuitry. A similar method can be employed on a dielectric surface, but an atomic force microscope, such as those described below, would be employed in place of an STM.

Resists, such as resist layer 49, are generally insulators. Consequently, after forming of resist layer 49, a selected portion of resist layer 49 formed on and immediately adjacent to alignment mark 48, is removed by conventional techniques. Alignment mark 48 is desirably provided sufficiently distant from areas of the surface of wafer 34 where it is desired to form structures or devices that misalignment in removing the selected portion of resist layer 49, does not result in removal of resist 49 from areas where it is desired to form devices or structures. During the steps of forming of desired devices and structures on wafer 34, numerous layers will be formed on alignment mark 48. It is preferred that each such layer be removed prior to the next succeeding alignment step.

It will be seen that the forward surface of mask 30 is sufficiently close to the surface of the wafer to permit the probe of the means for locating features on the wafer surface to be brought sufficiently close to the wafer surface to provide a tunneling current between the probe tip and the wafer surface. In X-ray lithography, it is conventional to hold the mask about 40 microns from the surface of the wafer. Thus, it is practical to provide a structure including a probe directly on the surface of the mask. It will be understood that, within the field of lithography, the structure illustrated in FIG. 1 may be used wherever the mask is provided in sufficiently close proximity to the surface of the wafer and is not limited to use on X-ray masks.

According to FIG. 1B, there is shown a cross-sectional view of an apparatus 32' according to the invention for use in aligning an X-ray mask to a semiconductor wafer. The apparatus 32' of FIG. 1B is similar to the apparatus of FIG. 1A, but is adapted to provide alignment without removal of resist 49 from alignment mark 48.

There is provided a substantially conventional probe 42' of an atomic force microscope ("AFM"). Support block 39 depends from mask 30. Conductive pad 41 depends from support block 39. Adjacent to conductive pad 41 and also depending from support block 39 there is provided bracket 43. Probe tip 45 depends from conductive pad 41. Arm 47 is provided on bracket 43. Arm 47 is provided immediately below the tip of probe tip 45, and is flexible, so that contact with the surface of wafer 34, or with the surface of resist 49, will cause arm 47 to deflect. Deflection of arm 47 changes a predetermined tunneling current between probe tip 45 and arm 47.

It is particularly desirable that alignment mark 48 have topographical edges, or, in general, relief to the wafer surface, in the embodiment of FIG. 1B. In this embodiment, unlike the embodiment of FIG. 1A, resist layers, and other layers, formed on alignment mark 48 are not removed. In general, such layers will be highly conformal, even when numerous layers are formed. Thus, the edges of alignment mark 48 will be detected. It is not necessary, in the embodiment of FIG. 1B, that alignment mark 48 be electrically conductive.

Figure 2:
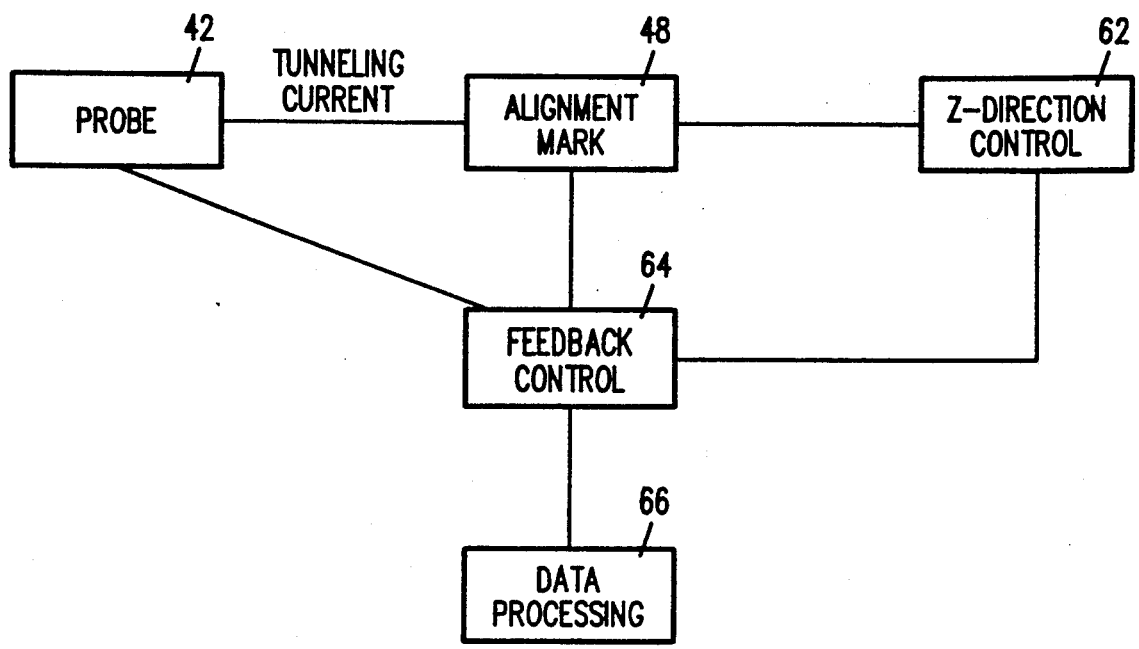
FIG. 2 is a block diagram of electrical connections in an apparatus according to the embodiment of FIG. 1.

FIG. 2 is a block diagram showing interconnections in an apparatus according to FIG. 1A. The probe 42 and alignment mark 48 are both electrically connected to feedback control 64. Probe 42 and alignment mark 48 are in electrical contact to the extent that a tunneling current is maintained between them when a selected voltage differential is maintained by feedback control 64. Z-direction control 62 is electrically connected to an output of feedback control 64.

The electrical connections in an apparatus according to FIG. 1B are similar. Probe tip 45 and arm 47 are both electrically connected to feedback control 64. Probe tip 45 and arm 47 are maintained in electrical contact to the extent that a tunneling current is provided between them when a selected voltage differential is maintained by feedback control 64.

Feedback control 64 functions in a substantially conventional manner for feedback controls in STM devices. Thus, feedback control 64 monitors the tunneling current between the probe 42 and alignment mark 48. Feedback control 64 provides to Z-direction control 62 a control signal. This control signal causes the Z-direction control to effect relative movement of the probe and the wafer surface in the Z-direction. In the embodiment illustrated, the wafer is moved while the probe is stationary.

An output of feedback control 64 is coupled to data processing apparatus 66. The feedback control provides Z-direction displacement data to data processing apparatus 66. The Z-direction displacement data is processed in accordance with conventional techniques to provide data regarding the location of alignment mark 48 on the wafer surface.

The apparatus of FIGS. 1 and 2 is used as follows. Mask 30 is located relative to wafer 34 in accordance with conventional alignment techniques. The probe 42 is then used to determine the location of the feature or alignment mark 48. Then the mask and wafer are provided in preselected spatial relationship. In determining the location of alignment mark 48, the wafer is first raised, or moved in the Z-direction toward the mask. At the same time, the STM is activated. When a tunneling current is detected, control of the Z-direction apparatus is transferred to the feedback control. The probe is then rastered across a selected area of the surface of the wafer. A suitable algorithm may be provided for control of the relative movement of the probe and the wafer in the plane of the wafer surface during rastering, so that an appropriate area of the surface is scanned. The data is transferred to data processing apparatus 66, which creates a map of the scanned area. A suitable algorithm may be provided for identification of the location on the map of the scanned area of the surface of the alignment mark, and also a selected point on the wafer surface.

The selected point for each mask must be that where, when the probe tip is at the selected point, registration is accurate. The mask will be in a preselected spatial relationship with the wafer when the probe tip is at the selected point. The location of the features on the mask relative to the location of the probe tip may vary among masks used on a single wafer as a result of slight differences in the process of forming the probe on the mask. Consequently, the relative locations of a reference feature on each mask and the probe tip must be previously ascertained. The relative locations are ascertained, for example, by performing metrology on the mask. For example, the completed mask may be scanned by a scanning electron microscope, using suitable calibration techniques. The data obtained from metrology is used to calculate a selected point for placement of the STM probe tip for each mask.

The selected point for placement of the STM probe tip for each mask is defined relative to the alignment mark. The selected point for each mask may be stored in memory. After scanning the wafer surface, an image is generated. The selected point is located on the detected image. The present location of the probe on the detected image is also noted, and the selected location and the detected location are compared. A suitable algorithm may be developed for this comparison. The comparison step will provide a required displacement of the wafer with respect to the mask. The controller then operates the wafer chuck to move the wafer until the desired location is achieved. The movement of the wafer completes the positioning of the wafer and mask in preselected relationship.

Figure 3:
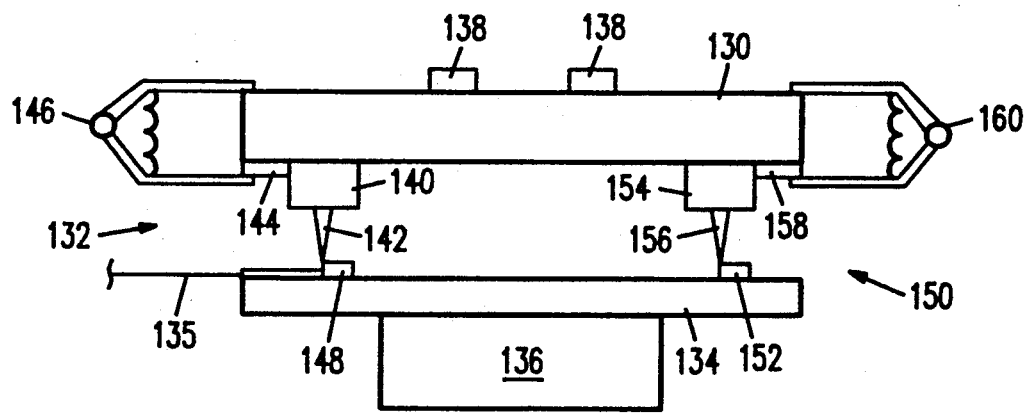
FIG. 3 is a sectional view showing an alternative embodiment of an apparatus according to the invention.

FIG. 3 illustrates in cross-section an apparatus for translational and rotational alignment of an X-ray mask with a wafer surface. The mask 130, wafer 134, and wafer mount 136, are as shown in FIG. 1 and described in the accompanying text. In this embodiment there is provided first means 132 for detecting the location of a feature on the wafer surface. This first detecting means 132 is identical to detecting means 32 of FIG. 1. Thus first detecting means 132 includes a conductive pad 140, a probe 142, a conductive line 144, and a clip 146. The wafer 134 has first alignment mark 148 provided thereon and conductive line 135 to provide an electrical connection thereto.

Second means 150 for detecting the location of a feature on the wafer surface is mounted on and depending from the forward face of the mask 130. Second detecting means 150 is substantially the same as first detecting means 132. Second detecting means 150 is located near an edge of the mask 130. Second detecting means 150 is on an opposite side of mask 130 from first detecting means 132. Second detecting means 150 includes a second conductive pad 154 mounted on the lower surface of the mask. Second STM probe 156 is attached to a lower surface of conductive pad 154. Conductive line 158 is provided on the lower surface of the mask. One end of conductive line 158 is in electrical contact with conductive pad 154. The other end of the conductive line 158 is substantially at the edge of the forward face of the mask 130. Clip 160 clips to the edge of mask 130 in electrical contact with conductive line 158. Clip 160 is attached to standard STM circuitry.

Figure 4:
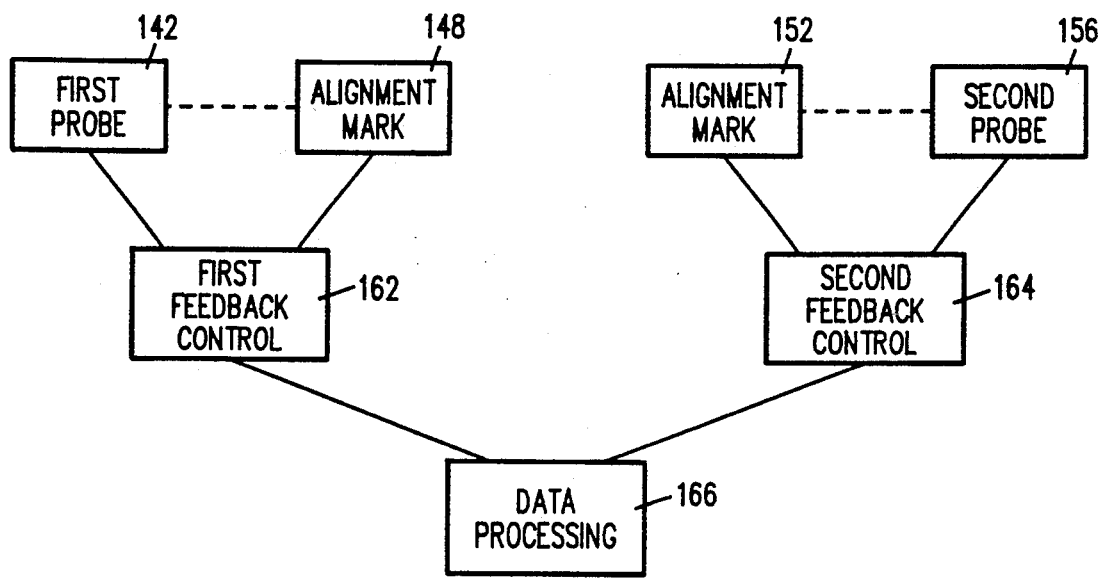
FIG. 4 is a block diagram of electrical connections in an apparatus according to the embodiment of FIG. 3.

With reference to FIG. 4, there is depicted a block diagram of the circuitry of an apparatus in accordance with the embodiment of FIG. 3 for detecting the rotational alignment of a mask to a wafer. The circuitry relating to each of the two detecting means 132 and 150 is substantially identical to that explained in connection with the embodiment of FIGS. 1 and 2. First probe 142 and alignment mark 148 are electrically connected to first feedback control 162. First feedback control 162 is a substantially conventional feedback control for use in STM devices. An output of first feedback control 162 is connected to Z-direction control 170. An output of first feedback control is connected to data processing unit 166. Z-direction information is transmitted by first feedback control 162 to data processing 166.

Second probe 156 is electrically connected to second feedback control 164. Alignment mark 152 is electrically connected to second feedback control 164. Second probe 156 and alignment mark 152 are electrically connected to the extent necessary to permit a tunneling current to flow between them. Second feedback control 164 is also a conventional feedback control for STM. The features in the surface can be observed by monitoring the tunneling current between the two probes when the water is rotated. The state must be manipulated until both probes provide the same relative mapping. It is within the capacity of one of ordinary skill in the art to design an algorithm to control the rotational movement of the wafer so as to obtain similar tunneling current responses from both probes.

The apparatus of FIG. 3 is operated as follows. The mask and the wafer are roughly aligned according to conventional techniques. Then the location of first and second features on the wafer surface is determined, using the probes 142 and 156. In determining the location of the features, initially the first detecting means 132 and the second detecting means 150 are activated. The wafer is moved in the Z-direction to the mask until a proper tunneling current is established between the wafer surface and one of the two probes 142 and 156. The wafer is then rotated until a tunneling current is detected between the other of the two probes 142 and 156 and the wafer surface. The two probes are then rastered over a desired area of the wafer surface in accordance with a suitable algorithm. The data processing unit then generates maps of the two areas of the wafer surface. The two maps are then compared. A suitable algorithm may be developed for comparing the two maps.

A comparison of the two maps will indicate whether the rotational alignment of the wafer and the mask is proper. If the two maps, after correcting for any misalignment of the probes in forming of the probes on the mask, show that the corresponding features on the two areas of the mask are in the correct relative positions, then there is no rotational misalignment. If corresponding features are not in correct relative positions in the two maps, then there is rotational misalignment.

If rotational misalignment is detected, a suitable algorithm may be developed for calculating the degree of rotational misalignment. A suitable algorithm may also be developed for ascertaining the amount of rotation of the wafer required to correct the rotational misalignment. The next step is the positioning of the mask in preselected spatial relationship with respect to both alignment marks. In the step of positioning, either the wafer or the mask may in principle be moved. In the disclosed embodiment, the wafer is rotated. The wafer may be withdrawn in the Z-direction from the mask prior to rotation, in order to avoid damage resulting from contact between the probes and the wafer surface.

It will be understood that this method and apparatus for detecting rotational misalignment is not limited to use with STM devices. Any type of scanned probe microscope may be used. For example, an AFM apparatus, as shown in FIG. 1B, may be employed, by modifying the apparatus of FIG. 1B to add a second AFM probe, and appropriate electrical connections. This method is also not limited to use in aligning masks with wafers. Any two objects may be aligned to high precision using this method and apparatus.

A method for detection of rotational misalignment of a first object with respect to a second object may also be practiced using the apparatus of FIG. 1. According to this embodiment of the method, the alignment mark must have a shape such that its orientation can be ascertained. For example, a conventional cross-shaped alignment mark may be employed. The position and orientation of the alignment mark are determined and stored prior to practice of this embodiment of a method of the invention. The probe is rastered over the surface, including the alignment mark. The data processing apparatus generates an image of the alignment mark, which is compared to the stored position and orientation. Any differences between the stored orientation of the alignment mark and the orientation obtained by the probe indicate a rotational misalignment. A suitable algorithm may be developed for calculating the degree of rotational misalignment. Similarly, comparison between the stored position of the alignment mark and the position obtained by the probe will indicate any translational misalignment, as discussed above. A suitable algorithm may also be developed for rotating the wafer to achieve positioning of the mask in a preselected spatial relationship and orientation with respect to the alignment mark. This step of positioning results in a desired rotational alignment being achieved.

Figure 5:
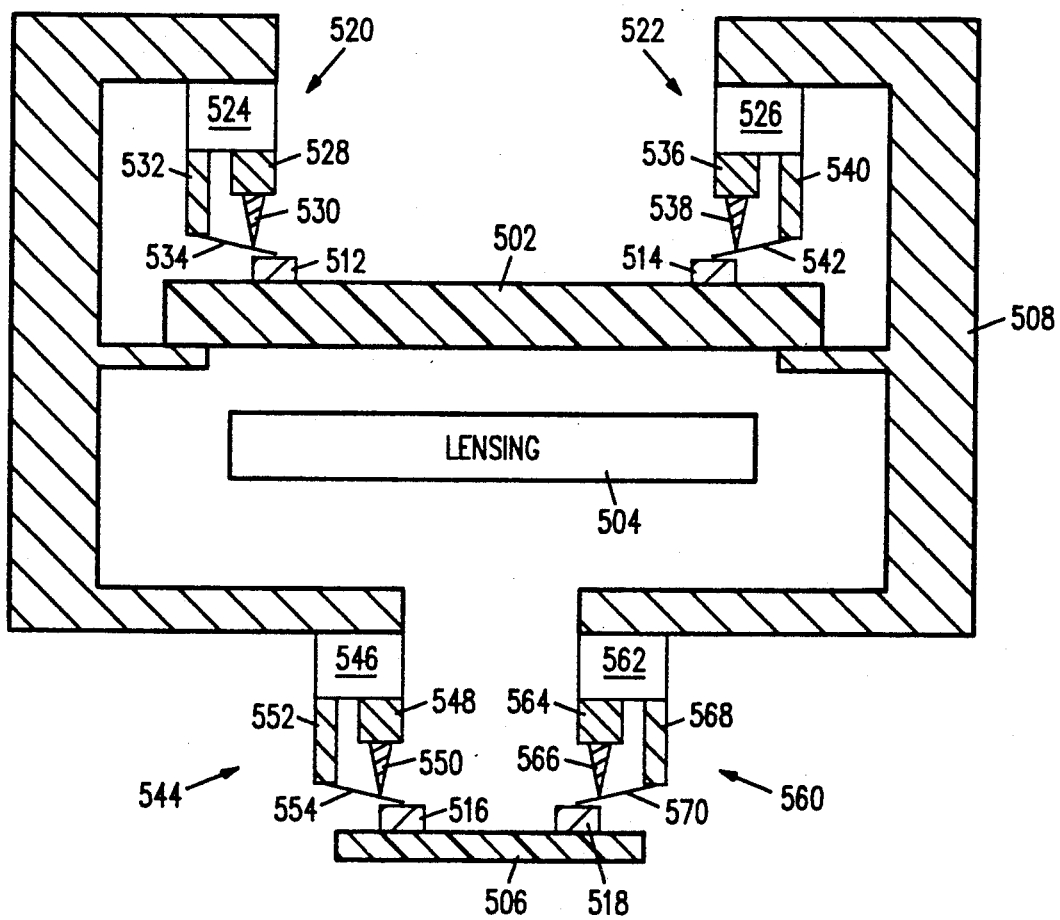
FIG. 5 is a sectional view showing an alternative embodiment of an apparatus according to the invention.

FIG. 5 is a sectional view of an embodiment of the invention for use in semiconductor device fabrication, specifically for use in optical lithography. In the apparatus illustrated in FIG. 5, optical lithography is accomplished by projecting light through mask 502 to form a pattern. The light then passes through lens 504, which causes the light to become focused on the surface of wafer 506. A rigid support structure or frame 508 is provided to hold mask 502. Support structure 508 also supports first means 520 for locating features on the mask, second means 522 for locating features on the mask, first means 544 for locating features on the wafer, and second means 560 for locating features on the wafer. The structure and function of the means for locating features will be explained below.

Mask 502 has alignment marks 512 and 514 located thereon. Similarly, wafer 506 has alignment marks 516 and 518 located thereon. The alignment marks may take any desired form. In the embodiment illustrated in FIG.

5, alignment marks 512 and 514 on the mask 502 are structures formed on the mask. The alignment marks may be formed simultaneously with the forming of a pattern on the mask. The alignment marks 516 and 518 on wafer 506 are illustrated as structures formed on the wafer surface. The alignment marks may be made of any material which can be conveniently used to form a structure on the wafer surface. The alignment marks on the wafer may alternatively be made, for example, as valleys cut into the wafer surface.

Alignment mark 512 on mask 502, and alignment mark 516 on wafer 506 are precisely located with respect to one another so that, when wafer 506 is properly positioned with respect to mask 502, the displacement of arm 534 relative to alignment mark 512 is the same as the displacement of arm 554 relative to alignment mark 516. Similarly, when wafer 506 is correctly positioned with respect to mask 502, the displacement of arm 542 relative to alignment mark 514 is the same as the displacement of arm 570 relative to alignment mark 518 on wafer 506. The positioning of the alignment marks may be confirmed by conventional techniques, such as by performing metrology on the mask.

The structure of the means for locating features will now be explained. First means 520 for locating features on the mask is a substantially conventional atomic force microscope. Piezoelectric block 524 depends from support structure 508. Conductive pad 528 depends from piezoelectric block 524. A probe 530 depends from conductive pad 528. Adjacent to conductive pad 528 there is provided a bracket 532, which also depends from piezoelectric block 524. A contact arm 534 is provided on bracket 532. Arm 534 is provided close to the tip of probe 530. As is conventional in atomic force microscopes, piezoelectric block 524 is operated in a conventional manner to move the structure with respect to support frame 508 and thus with respect to mask 502. Arm 534 contacts the surface of mask 502. Arm 534 and the tip of probe 530 are maintained, in accordance with conventional techniques in the art, a short distance apart, with an applied voltage between them, so as to cause a tunneling current to flow between the probe tip and the surface of arm 534. The tunneling current is detected in accordance with conventional techniques. As the arm is moved over the surface of the mask, changes in the mask topography cause the arm to move either closer to or further from the probe tip, thereby causing a change in the tunneling current. Alternatively, as is also conventional, a feedback circuit may be provided so that the piezoelectric block causes the apparatus to move vertically when the arm moves in a vertical direction, so as to provide a substantially constant tunneling current.

Second means 522 for locating features on the mask is a substantially identical conventional atomic force microscope. Piezoelectric block 526, which depends from support frame 508, causes the arm and the probe to move with respect to the frame. A conductive pad 536 depends from piezoelectric block 526. A probe 538 depends from conductive pad 536. Immediately adjacent to conductive pad 536 a bracket 540 depends from the piezoelectric block 526. Arm 542 is mounted on the end of bracket 540, and extends directly below the tip of probe 538. Second means 522 for locating features on the mark operates in the same manner as first means 520 for locating features on the mask.

It will be understood that either first means 520 for locating a feature on the mask, or second means 522 for locating a feature on the mask, may be used in accordance with the techniques described above, to ascertain the relative location of alignment marks 512 and 514 with respect to support structure 508. In addition, rotational misalignment may be detected by comparing the relative positions of marks 512 and 514.

First means 544 for locating features on the wafer, and second means 560 for locating features on the wafer will now be briefly described. Both first means 544 for locating features on the wafer and second means 560 for locating features on the wafer are substantially conventional atomic force microscope devices, which are well known in the art. First means 544 for locating features on the wafer includes a piezoelectric block 546 depending from a lower arm of support frame 508. Piezoelectric block 546 has conductive pad 548 depending therefrom. Probe 550 depends from conductive pad 548. Bracket 552 also depends from piezoelectric block 546. Arm 554 is mounted on bracket 552 and extends so as to be directly below the tip of probe 550.

Similarly, second means 560 for locating features on the wafer includes piezoelectric block 562 also depending from an arm of support structure 508. Conductive pad 564 is disposed depending from piezoelectric block 562. Bracket 568 is also disposed depending from piezoelectric block 562. Probe 566 depends from conductive pad 564. Arm 570 is attached at one end to bracket 568 and it extends so that it is immediately below the tip of probe 566.

First means 544 for locating features on the wafer and second means 560 for locating features on the wafer are operated in a conventional manner of atomic force microscopes. It will be appreciated that both first means 520 for locating features on the mask and first means 544 for locating features on the wafer are attached to support frame 508 and are thereby maintained in a fixed spatial relationship with respect to one another. Second means 522 for locating features on the mask, and second means 560 for locating features on the wafer are also maintained in fixed spatial relationship with one another, as each is attached to support frame 508.

When the wafer is brought into the proper position below first means 544 for locating features on the wafer, and second means 560 for locating features on the wafer, both first means 544 and second means 560 for locating features on the wafer are operated to determine the location of alignment marks 516 and 518 on the wafer with respect to support frame 508. The location of the alignment marks may then be compared, using suitable algorithmic techniques, to the detected location of the alignment marks 512 and 514 on mask 502. Any differences in alignment, resulting either from misalignment of the mask in its holder, or misalignment of the wafer, may be corrected by suitable movement of the wafer until the respective alignment marks are in registration to a desired degree of accuracy. A suitable algorithm may be provided to accomplish the necessary movement of the wafer. The wafer, for example, may be moved downward far enough to deactivate the means 544 and 560 for locating features on the wafer. The wafer may then be moved to correct for translational and rotational misalignment with respect to the mask. It will be appreciated, as explained above in connection with FIG. 1, that detection of rotational misalignment may be accomplished by the use of only one probe on the mask and one probe on the wafer.

The wafer may then be moved in the upward direction to reactivate the first and second means 544 and 560 for locating features on the wafer. Then first and second means 544 and 560 for locating features on the wafer may be operated in accordance with conventional techniques to map the appropriate regions of the wafer surface to confirm that the alignment marks are located in registration with respect to the corresponding alignment marks on the mask. If the respective alignment marks are not in registration within the desired degree of accuracy, the process of adjusting the position of the wafer may then be repeated, and the resulting location tested by use of the first and second means 544 and 560 for locating features on the wafer, until the desired degree of accuracy is achieved.

It will be seen that the embodiment of the invention illustrated in FIG. 5 is an advantageous technique for minimizing errors in registration in optical lithography. In successive exposure steps, the mask need not be located in precise registration with respect to its holder. Rather, the position of the wafer may be corrected so as to compensate for misalignment of the mask with respect to its holder.

It will be understood that first and second means 544, 560 for locating features on the wafer and first and second mean, 520, 522, for locating features on the mask need not be in fixed spatial relationship, so long as the spatial relationship is known.

Figure 6:
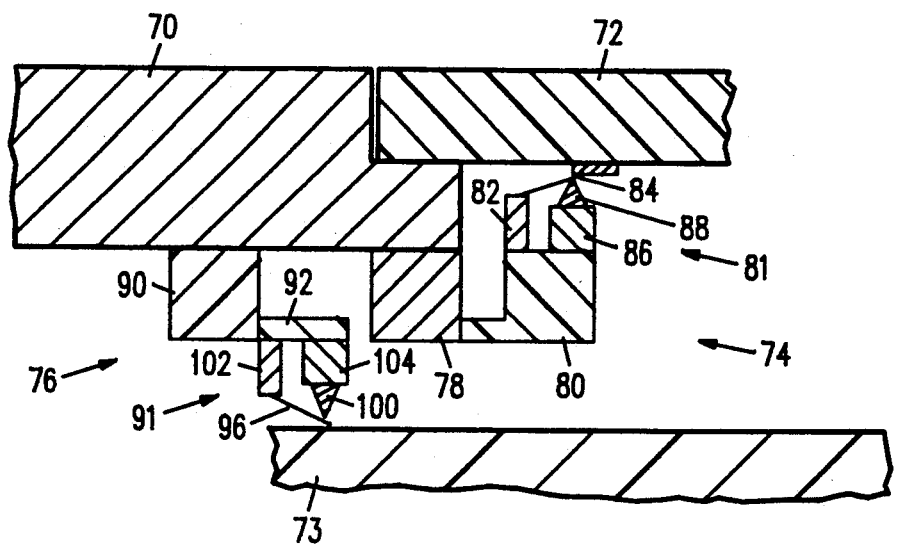
FIG. 6 is a sectional view showing an alternative embodiment of an apparatus according to the invention.

FIG. 6 is a sectional view of an embodiment of the invention in which AFM devices are used to measure displacement between a mask holder and a mask and between the holder and a wafer surface. A mask holder 70 is shown. Mask 72 is supported along an edge by mask holder 70. A wafer 73 is shown disposed forward of mask 72 and holder 70. Means 74 for measuring displacement between the holder and the mask is provided depending from mask holder 70. Means 76 for measuring displacement between the holder and the wafer surface also depends from mask holder 70.

Means 74 for measuring displacement between the holder and the mask includes an AFM device 81 movable on piezoelectric block 78. Piezoelectric block 78 is attached to and depends from mask holder 70. Piezoelectric block 78 has conventional electrical connections (not shown) to permit contraction and expansion when voltage differentials are applied in the x, y, and z directions.

Support arm 80 depends from piezoelectric block 78. AFM device 81 is mounted on support arm 80. AFM device 81 has, as is conventional, a lever 84 for contacting a surface, and an STM probe 88. Support arm 80 is constructed and located so as to place the lever 84 of AFM device 81 in contact with a forward surface of mask 72. Probe 88 is located adjacent to lever 84 opposite from the mask surface. In operation, a tunneling current flows between lever 84 and probe 88.

Bracket 82 is mounted on support arm 80. Lever 84 is attached at one end to bracket 82. Probe base 86 is also mounted on support arm 80 adjacent to bracket 82. Probe 88 is attached to probe base 86. Electrical connections (not shown) are provided to lever 84 and probe 88 in a conventional manner.

Means 76 for measuring displacement between the holder and the wafer surface includes an AFM device 91. AFM device 91 is here shown movable on piezoelectric block 90. It will be evident that relative displacement between the AFM device and the wafer surface may be accomplished by movement of the wafer while the AFM device's position on the holder is fixed.

Piezoelectric block 90 is attached to and depends from mask holder 70 adjacent to piezoelectric block 78 for the means 74 for measuring displacement between the holder and the mask. Piezoelectric block 90 has conventional electrical connections (not shown) to permit contraction and expansion when voltage differentials are applied in the x, y, and z directions.

Support arm 92 is attached to and depends from piezoelectric block 90. AFM device 91 is mounted on support arm 92. AFM device 91 includes a lever 96 and a probe 100. Probe 100 depends from probe base 104, which depends from support arm 92. Lever 96 depends from bracket 102, which depends from support arm 92. Lever 96 is for contact with the wafer surface. Probe 100 is located adjacent to lever 96 opposite from the wafer surface. In operating a tunneling current flows between lever 96 and probe 100. Forces applied by the lever 96 on the wafer surface are also kept constant.

The feedback control transmits z-direction displacement information to a data processing unit. This information is processed by a data processing unit in accordance with conventional techniques.

The operation of the embodiment of the invention according to FIG. 6 will now be explained. The mask 72 is positioned in the mask holder 70 in accordance with conventional techniques. The relative displacement of the mask 72 and the mask holder 70 may be ascertained using means 74. The piezoelectric block 78 is operated in the z-direction to bring lever 84 in contact with the mask surface, so that a tunneling current is generated between the probe 88 and lever 84.

The AFM unit 81 is then rastered on the surface of the mask. The piezoelectric block 78 is operated, in this embodiment, to raster the AFM unit 81. A data processing unit can then process the tunneling current information regarding the surface of the mask in the area that the AFM has rastered to produce an image or map of the surface.

It is preferable in practicing this embodiment of the invention to have a stored reference image of the relevant sections of the mask surface. Such reference image may have been previously obtained by metrology on the mask. The stored reference image is then compared with the image obtained in scanning the surface. The features identified in the newly-obtained image can be compared to the reference image to determine the location of the AFM lever on the mask. It is only necessary to scan the mask surface until the scanned area can be identified on the reference image. A home position for the AFM is desirably designated on the reference image. A detected position for the AFM is then located relative to the reference home position. The relative displacement of the reference home position and the detected home position indicates the displacement of the mask from its proper position.

The means 72 for detecting the position of the wafer relative to the holder is then activated. Initially, the lever 96 is brought into contact with the wafer surface. The z-direction orientation of the wafer and the holder is changed until a desired tunneling current is observed between the probe 100 and the lever 96. The AFM 91 is then rastered over the wafer surface. An alignment mark is located. When the AFM is at the alignment mark, and the mask is properly positioned in the holder, the mask and the wafer are properly aligned. Thus, if the mask is not properly positioned in the holder, it is necessary to effect relative displacement of the holder and wafer to obtain alignment. The wafer may be translated in the plane of the wafer surface to correct for the displacement of the mask from its proper position in the holder. As a result, the mask and the wafer are in alignment, to a very high accuracy.

Figure 7:
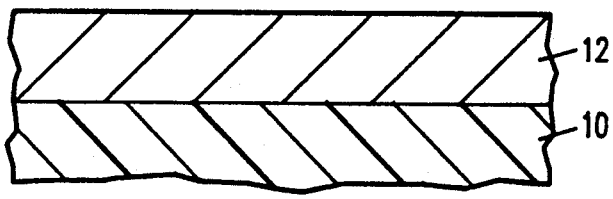
FIG. 7 is a sectional view before a first step of making a probe for use in an apparatus according to the invention.

A process for forming a probe for a scanned probe microscope on a mask or other substrate will now be explained with reference to FIGS. 7 through 14. With reference to FIG. 7, there is shown in section a partial view of a surface of a substrate 10. The substrate 10 may be a glass plate of a mask for use in optical lithography. The substrate may be alternatively a silicon nitride membrane having a thickness of about 5000 angstroms, for use in X-ray lithography. Substrate 10 may also be a thick glass plate for use in optical lithography. A thin layer 12 of a metal is formed on substrate 10. The layer 12 will be referred to as the adhesion layer. The layer 12 is typically about 500 angstroms in thickness. The thin layer 12 is preferably of titanium tungsten.

Figure 8:
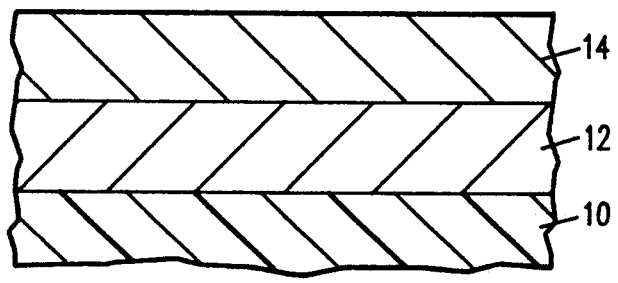
FIG. 8 is a sectional view, similar to FIG. 7, after forming of an adhesion layer.
Figure 10:
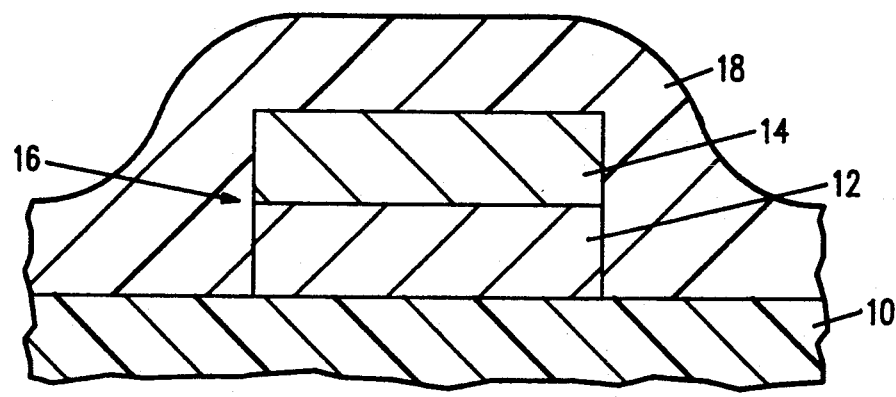
FIG. 10 is a sectional view, similar to FIG. 9, after forming of a dielectric layer.

With reference to FIG. 8, there is depicted a sectional view similar to FIG. 10, but after forming of layer 14 on adhesion layer 12. Layer 14 is a tungsten layer. Adhesion layer 12 acts to seed the deposition of layer 14. Tungsten layer 14 is preferably about 500 angstroms thick.

The desired pattern is then formed on the glass substrate 10 in the layers 12 and 14. In accordance with conventional techniques, a resist is applied on layer 14. A resist (not shown) is exposed, preferably by electron beam direct write techniques, and then developed. The layers 12 and 14 are then etched to provide a pattern on the glass substrate 10. The pattern provides a pattern for imaging on substrate 10 as well as locations for the addition of probe tips. Locations for bases for arms of AFM's (as explained below) may also be provided. Conductive lines to connect probe tip bases to an edge of the apparatus may also be provided. Layers 12 and 14 are etched using a $CF_4$-chlorine reactive ion etch (RIE etch) at 60 millitorr pressure at a gas flow rate ratio of $CF_4$ to chlorine of 5 to 1, with a typical $CF_4$ flow rate of 50 SCCM.

Figure 9:
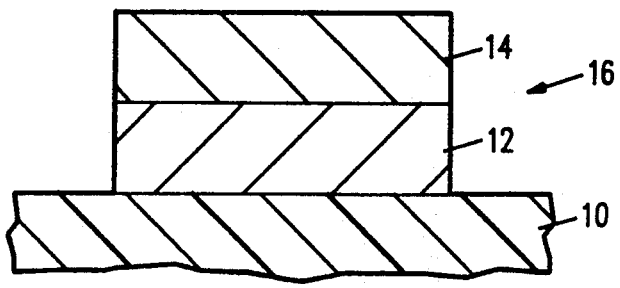
FIG. 9 is a sectional view, similar to FIG. 8, after forming of a pad.

At least one conductive base or pad 16 is provided as a result of the step of providing a pattern on the substrate 10. The pad 16 is shown in FIG. 9. A pad is provided wherever it is desired to provide a probe. A pad 16 comprises a tungsten surface layer 14. If it is desired to provide more than one probe, then more than one pad will be provided on a single mask.

After formation of the pattern on the substrate 10, a layer of dielectric is formed on the substrate. The dielectric may be an silicon dioxide, and will generally be a glass. The dielectric layer 18 is shown in FIG. 10.

Figure 11:
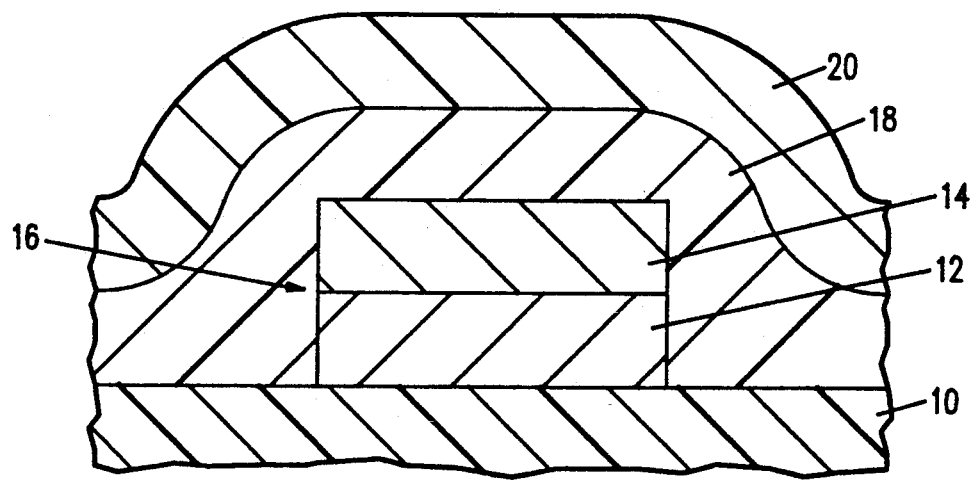
FIG. 11 is a sectional view, similar to FIG. 10, after forming of a spin-on-glass layer.

As shown in FIG. 11, there is then formed on the dielectric layer 18 a spin-on-glass layer 20. The spin-on-glass layer 20 may be a siloxane resin.

Figure 12:
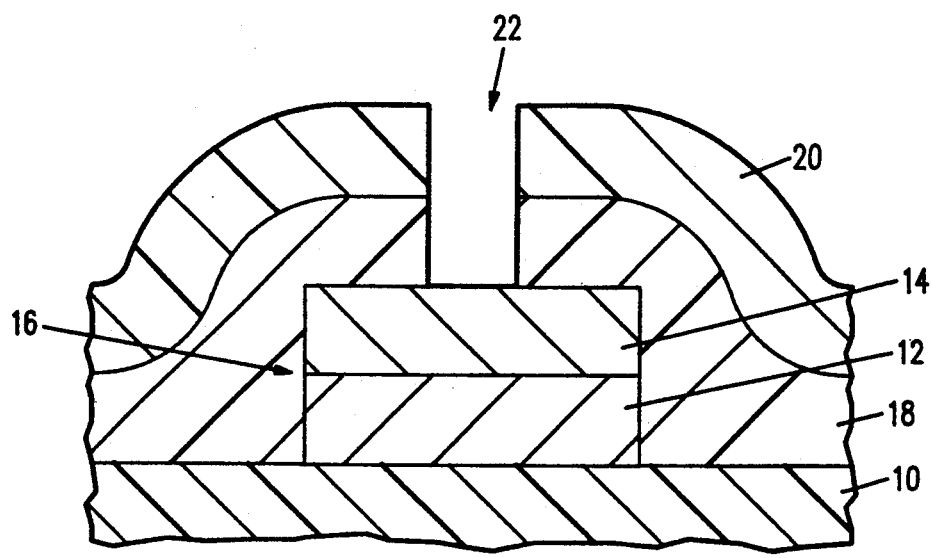
FIG. 12 is a sectional view, similar to FIG. 11, after forming of a hole.

After the step of forming the spin-on-glass layer 20, a hole is etched through the spin-on-glass layer 20 and the dielectric layer 18 to the tungsten surface layer 14 of the pad 16. The result of this step of etching a hole is shown in FIG. 12. The hole 22 is formed in accordance with conventional techniques. A resist is formed on the layer 20. The resist is exposed and developed, leaving a hole in the resist where it is desired to form the hole 22. The layers 20 and 18 are etched in accordance with conventional techniques for etching spin-on-glass and glass dielectric layers. For example, $CF_4$-oxygen RIE etching techniques, at a $CF_4$ to oxygen ratio of 5 to 1, with a $CF_4$ flow rate of 75 SCCM at 60 millitorr pressure, may be used. The resist is then removed. The result of these steps is the structure shown in FIG. 12.

Figure 13:
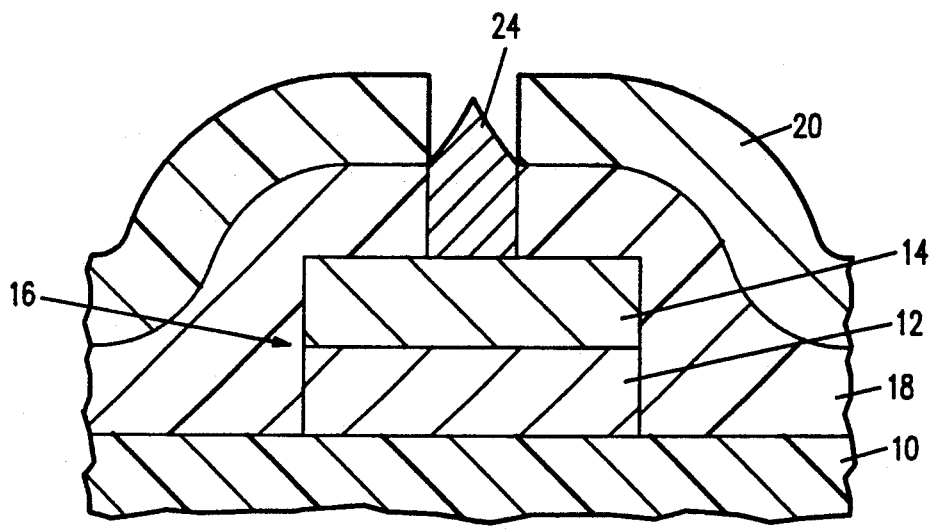
FIG. 13 is a sectional view, similar to FIG. 12, after forming of a probe.

After the step of forming the hole 22 through the spin-on-glass and dielectric layers through to the pad 16, the step of actually forming the probe on the pad is performed. Tungsten is selectively deposited by employing chemical vapor deposition techniques where $WF_6$ is reduced with hydrogen at temperatures between 300° C. and 450° C. The hydrogen to $WF_6$ ratio is 10 to 1 at 300 millitorr pressure, and a hydrogen flow rate of one liter per minute. The tungsten will only begin to grow using chemical vapor deposition techniques, on the tungsten surface layer 14. As a result of the conditions during which the chemical vapor deposition of tungsten takes place, the spin-on-glass layer 20 will begin to emit gases. These gases will be emitted sideways into the hole 22. The movement of these gases from the exterior to the center of the hole 22 will cause the tungsten to form preferentially in the center of the hole 22. As a result, the tungsten will form in the shape of a cone 24 as shown in FIG. 13. Thus the conical probe 24 is provided on the pad 16. It can be envisioned that any high-temperature polymeric material which could emit gases during the deposition process which suppresses CVD tungsten growth, could be used for this application.

Figure 14:
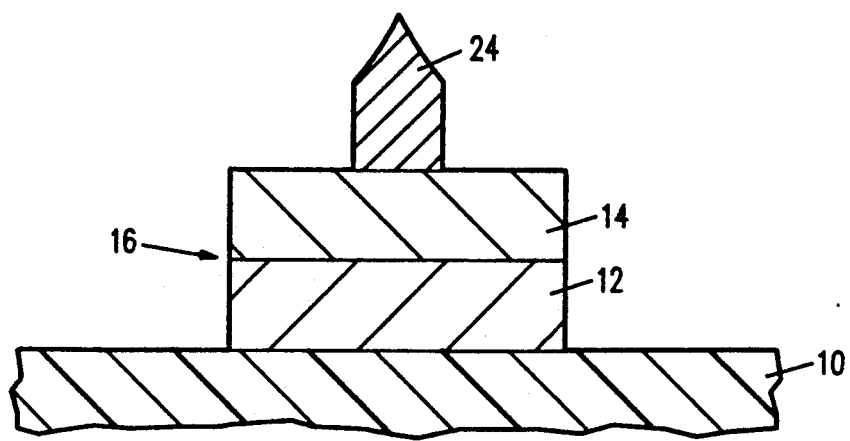
FIG. 14 is a sectional view, similar to FIG. 13, after removal of a spin-on-glass layer and a dielectric layer.

As shown in FIG. 14, after formation of the probe 24, the spin-on-glass layer 20 and the glass dielectric layer 18 are removed. These layers are removed in accordance with conventional stripping techniques using hydrofluoric acid, for example, with the underlying field nitride protecting the glass plate from attack. It should be noted that, with care, the spin-on-glass material can be chemically stripped while leaving some of the underlying oxide.

After removal of the glass layers, the emitter or probe 24 may have a dirty surface. By a dirty surface, it is meant that various materials other than tungsten that were used in the initial tip formation steps have adhered to the surface of the emitter 24. It is thus desirable to create a clean surface by selectively depositing more tungsten on the probe 24 or cleaning the surface by hydrogen reduction in accordance with conventional techniques. Then the surface is heat treated in a hydrogen reduction atmosphere in accordance with conventional techniques. It is also known to those skilled in the art that probe tips can be chemically sharpened.

With reference to FIGS. 15 to 23, there will now be explained a method for providing an AFM probe on a substrate. FIG. 15 is a top view of a patterned structure formed on substrate 10. FIG. 15A is a cross-section taken along line A—A of FIG. 15. Substrate 10 may be a conventional silicon substrate, or other dielectric. Formed on substrate 10 are conductive pads 12 and 25, conductive contacts 220 and 222, and conductive lines 13, 15. Conductive line 15 connects pad 25 and contact 220. Conductive line 13 connects pad 12 and contact 222. Contacts 220, 222, are preferably substantially larger in area than are pads 12, 25. Contacts 220, 222, may be, for example, 100 microns in length on each side, while pads 12, 25, may be, for example, 25 microns in length on each side. Conductive lines 13, 15 may be as narrow as desired. Contacts 220, 222, pads 12, 25 and lines 13, 15, are all preferably of a bilayer metallization of pure tungsten 14 on a titanium-tungsten alloy 16, and are formed by deposition, masking, and etching techniques as described above in connection with FIGS. 10-12.

Figure 16:
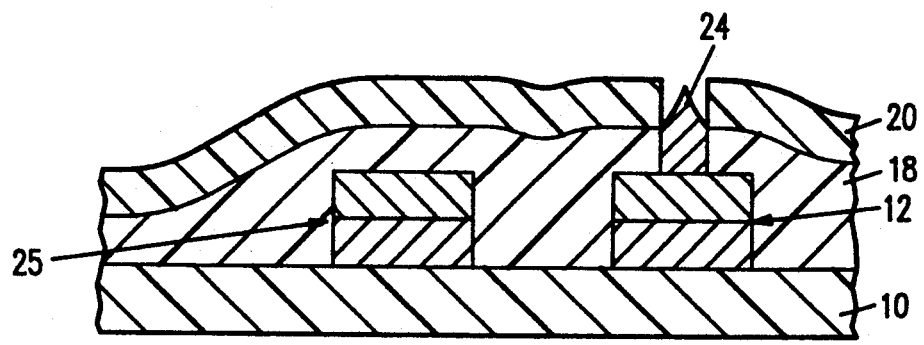
FIG. 16 is a partial sectional view, taken along line B—B of FIG. 15, after the forming of a probe.

Referring to FIG. 16, which is a partial cross-section taken along line B—B of FIG. 15, there are depicted pads 12 and 25 after the step of forming of an STM probe 24 on pad 12. STM probe 24 is preferably formed in accordance with techniques described above. Dielectric layer 18 has been applied on pads 12, 25, as well as contacts 220, 222 (not shown) and lines 13, 15 (not shown). Spin-on-glass layer 20 has been applied on dielectric layer 18. A hole was opened through spin-on-glass layer 20 and dielectric layer 18 to expose a portion of the surface of pad 12, and probe 24 is formed by chemical vapor deposition of tungsten.

Figure 17:
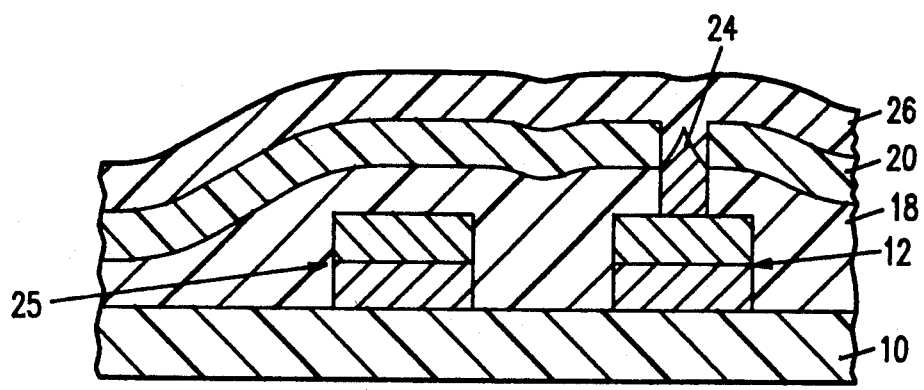
FIG. 17 is a partial sectional view, similar to FIG. 16, after a step of applying a dielectric layer.
Figure 18:
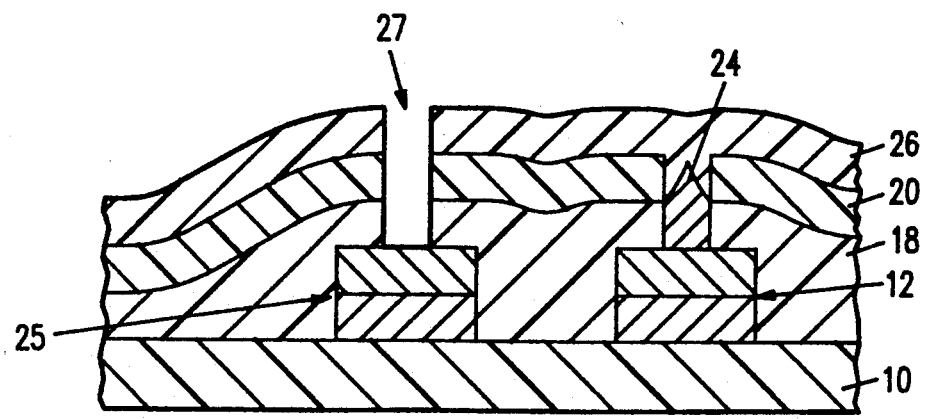
FIG. 18 is a partial sectional view, similar to FIG. 17, after a step of forming a hole.
Figure 18A:
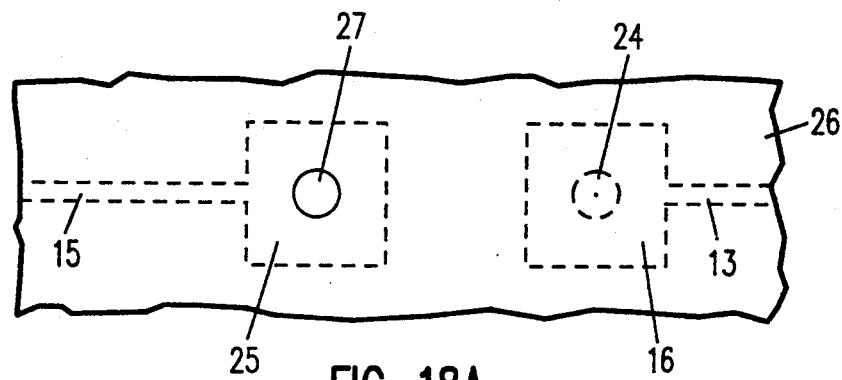
FIG. 18A is a partial top view of the structure shown in partial section in FIG. 18.

Referring to FIG. 17, there has now been applied on spin-on-glass layer 20 and probe 24 an insulating layer 26. Insulating layer 26 may be a conventional dielectric. Referring to FIG. 18, a hole 27 is then provided by means of conventional patterning and etching techniques, through insulating layer 26, spin-on-glass layer 20, and dielectric layer 18, to the surface of second pad 25. FIG. 18A is a top view of the structures depicted in FIG. 18.

Figure 19:
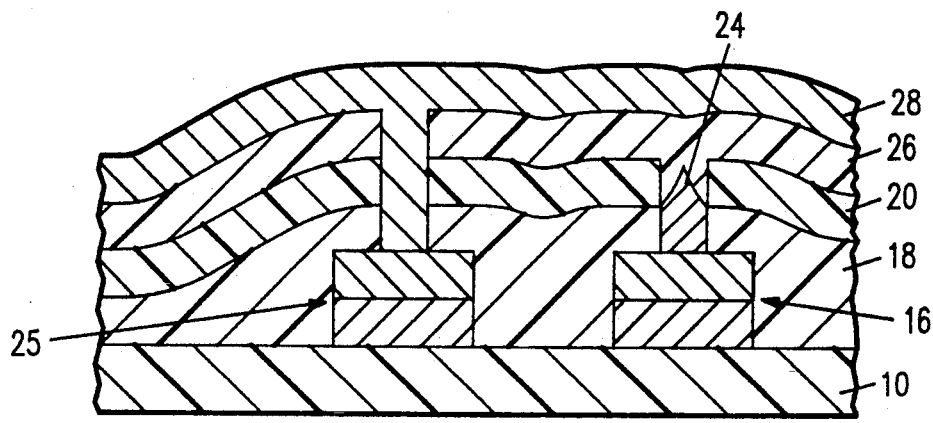
FIG. 19 is a partial sectional view, similar to FIG. 18, after a step of depositing a metal.

Referring to FIG. 19, a metal 28 is then deposited over the insulating layer 26, and completely filling the hole 27. The second conductive pad 25 is then in electrical contact with the metal layer 28. The insulating layer 26 electrically isolates the probe 24 and the metal layer 28.

Figure 20:
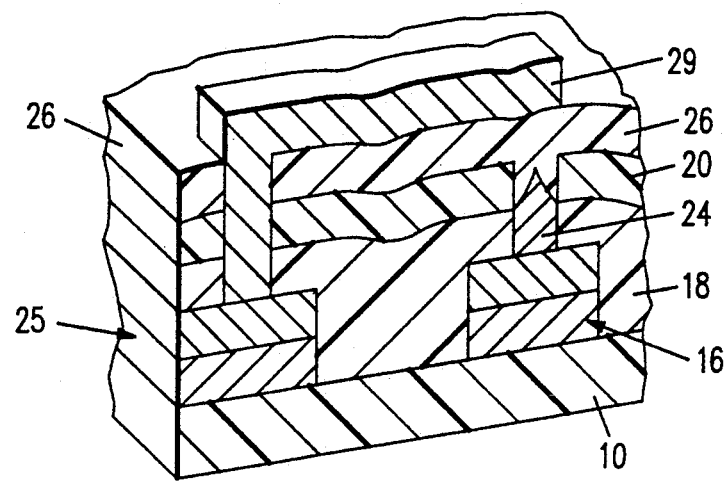
FIG. 20 is a cutaway isometric view of the structure shown in FIG. 19, after a step of forming an arm.

Referring to FIG. 20, which is a partial, schematic, isometric view of a section of a structure formed according to a method of the invention, the metal layer 28 is now patterned and etched, according to conventional techniques, to provide a metal strip or arm 29 on the surface of the insulating layer 26. The metal arm 29 is in electrical contact at one end thereof with the second conductive pad 25 through the metal-filled hole 27. The opposite end of the metal arm 29 is disposed over the tip of probe 24.

Figure 21:
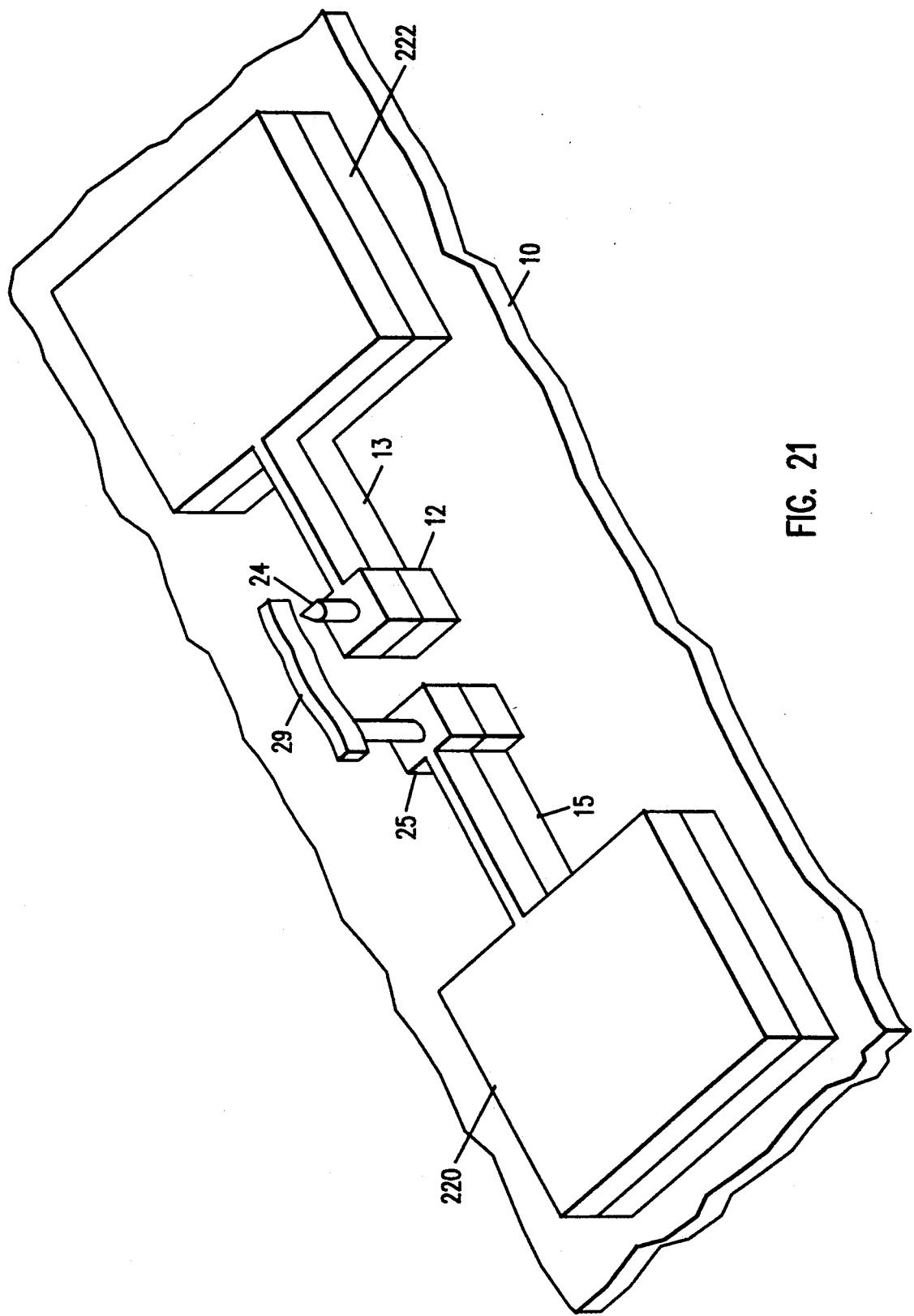
FIG. 21 is an isometric view of the structure shown in FIG. 20, after removal of process layers.

Referring to FIG. 21, which is a schematic, isometric view of a structure formed according to a method of the invention, the dielectric or insulating layer 26, the spin-on-glass layer 20, and the dielectric layer 18 are now stripped, by conventional techniques. The metal arm 29 remains supported at one end by a metal column formed by the metal that filled hole 27. At an opposite end, the metal arm 29 is disposed directly over the tip of probe 24. The metal arm 29 is disposed sufficiently close to the tip of probe 24 to permit the providing of a tunneling current between the arm 29 and the probe 24. Contacts 220, 222 are now exposed. It will be noted that a tungsten layer has been provided on contacts 220, 222, and connectors 13, 15. The tungsten layer is allowed to form on contacts 220, 222, and connectors 13, 15, for convenience in making the apparatus. However, it is not essential that a tungsten layer be provided on contacts 220, 222 and connectors 13, 15. The structure shown in FIG. 21 may be used as the probe of an AFM. Suitable electrical connections may be made to contacts 222 and 220. Connectors 13, 15 may be as long as desired, so that the steps of making electrical connections to contacts 222 and 220 will involve minimal risk of accidental damage to the AFM structure.

There will now be described with reference to FIGS. 22 through 31, a further embodiment of a method of forming an AFM probe according to the invention. Referring to FIG. 24, there is shown in partial cross-section a substrate 300 with a release layer 302 disposed thereon. Substrate 300 may be, for example, a conventional silicon wafer surface. It will be understood from the following description of this method of making an AFM probe that the particular material of which substrate 300 is composed does not affect the process according to the invention.

Release layer 302 may be, for example, a resist or other high-temperature organic material. Release layer 302 may be, by way of further example, a metal that is attacked, or dissolved, by a suitable etchant. In general, release layer 302 may be comprised of any material that can be removed, preferably by a solvent or etchant, with no or minimal damage to the metal layers that are applied in later steps, described below, according to the method.

Referring now to FIG. 23, there is depicted a dielectric layer 304 disposed on release layer 302. Dielectric layer 304 may be any conventional insulating material. For example, dielectric layer 304 may comprise silicon dioxide. Dielectric layer 304 may be formed by any conventional technique, such as by CVD. In general, dielectric layer 304 may be comprised of any insulating material that may be suitably patterned, and that will be removed, such as by a solvent or an etchant, with little or minimal damage to metal layers that are applied in steps of the method described below.

Referring now to FIGS. 24 and 24A, there is formed a hole 306 through dielectric layer 304. Hole 306 has sloping sides, so that hole 306 has the form of a truncated cone, with its base at the upper surface of dielectric layer 304. Any technique known to the art for forming hole 306 may be used. For example, dielectric layer 304 may be patterned by applying a suitable resist, exposing and developing the resist to expose a selected portion of dielectric layer 304 where hole 306 is to be formed, and then etching dielectric layer 304 by a technique that forms a hole having sloping sides.

Figure 25:
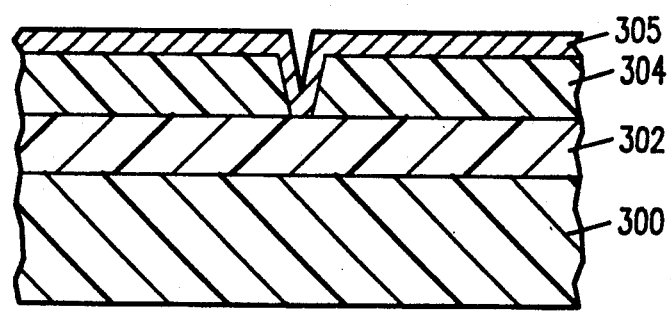
FIG. 25 is a cross-sectional view, similar to FIG. 24, after the step of forming of an adhesion layer.
Figure 26:
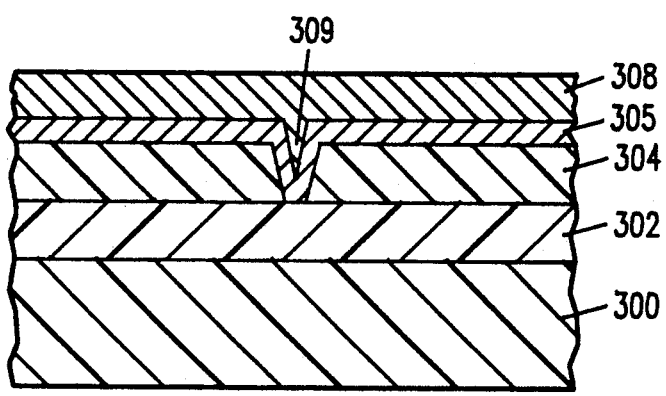
FIG. 26 is a cross-sectional view, similar to FIG. 25, after the step of forming of a first metal layer.

Referring now to FIG. 25, there has been deposited, on dielectric layer 304, and into hole 306, adhesion layer 305. Adhesion layer 305 may be formed of any conventional material which is used as an adhesion layer prior to the deposition of tungsten. For example, adhesion layer 305 may comprise aluminum or a titanium compound. Adhesion layer 306 may be formed by conventional techniques, such as by sputtering. Referring now to FIG. 26, there is deposited on adhesion layer 305, metal layer 308. Metal layer 308 is preferably formed of tungsten, by conventional chemical vapor deposition techniques, although physical vapor deposition can alternatively be used. It will be noted in FIG. 26, that tungsten layer 308 has completely filled the interior of hole 306 Adhesion layer 305 had already formed a thin layer on the interior surface of hole 306. Thus, it will be seen that metal layer 308 has a generally conical projection 309 formed thereon where hole 306 was located.

Figure 27:
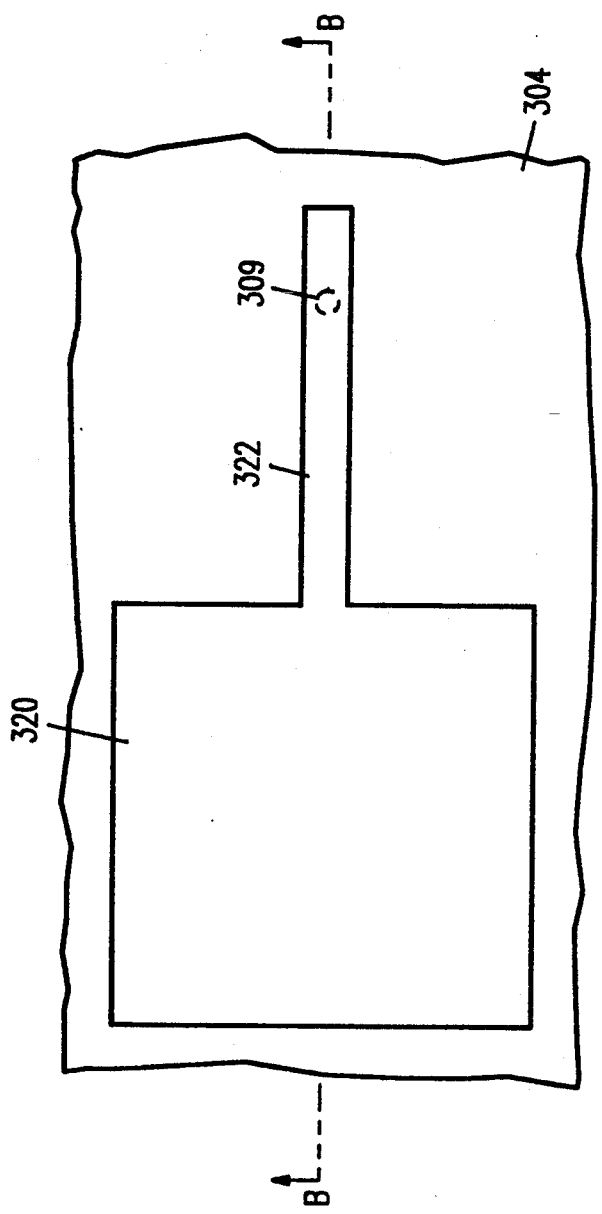
FIG. 27 is a top view of the structure of FIG. 26 after a patterning step.
Figure 28:
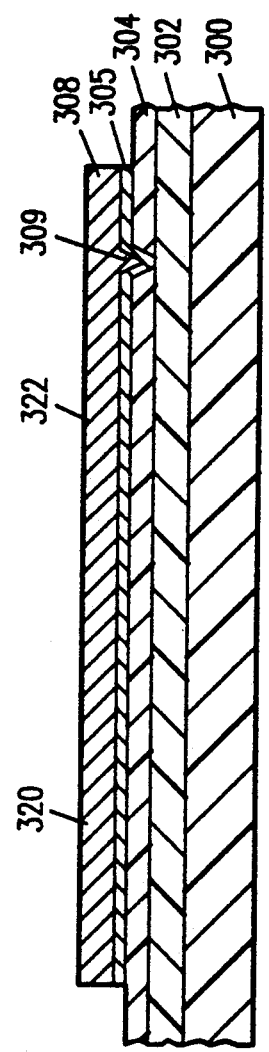
FIG. 28 is a cross-section taken along line B—B of FIG. 27.

Referring to FIG. 27, and FIG. 28, which is a cross-section taken along line B—B of FIG. 27, metal layer 308 is then patterned and etched, by conventional masking and etching techniques, to define a contact 320, and arm 322. Contact 320 may be, as shown, a substantially square structure having a large area. Contact 320 desirably has a large area, with a substantial length from its center to the nearest edge. Arm 322 is attached at one end to contact 320 and is integral with conical projection 309.

Figure 29:
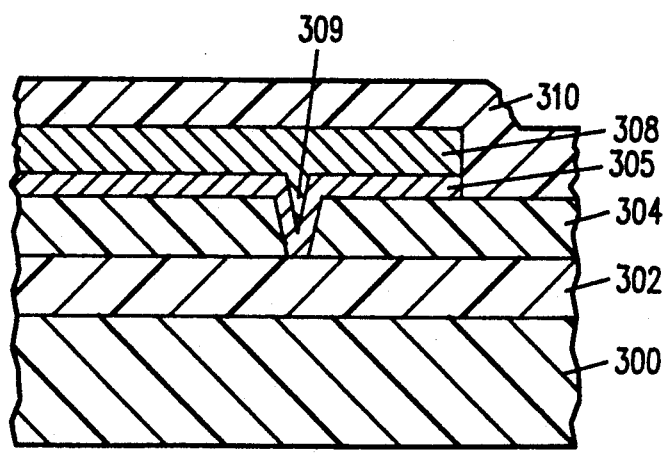
FIG. 29 is a partial cross-sectional view, similar to FIG. 28, after the step of forming of a dielectric layer.

Referring now to FIG. 29, which is a partial cross-section, similar to FIG. 28, there has been formed dielectric layer 310 on metal layer 308 and exposed portions of dielectric layer 304. Dielectric layer 310 is preferably formed of silicon dioxide. Dielectric layer 310 may be formed of any insulating material that will be removed, particularly by a solvent or etchant, with little or no damage to metal layer 308 and to a second metal layer applied further on in this detailed description. Dielectric layer 310 may be formed by conventional techniques, such as chemical vapor deposition techniques.

Figure 30A:
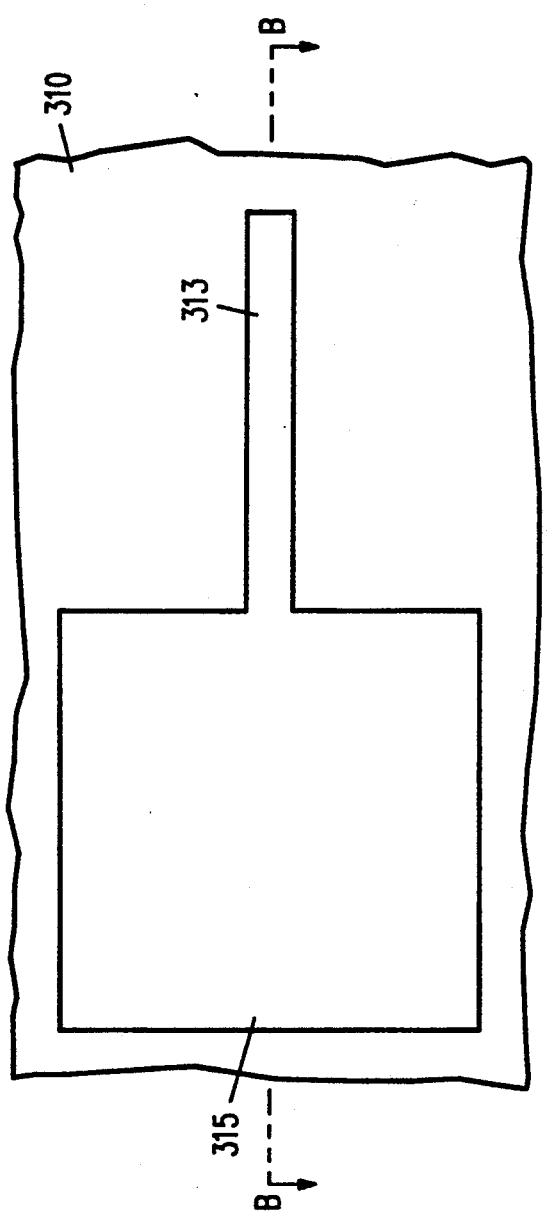
FIGS. 30A is a top view of the structure of FIG. 30 after a step of patterning.
Figure 30B:
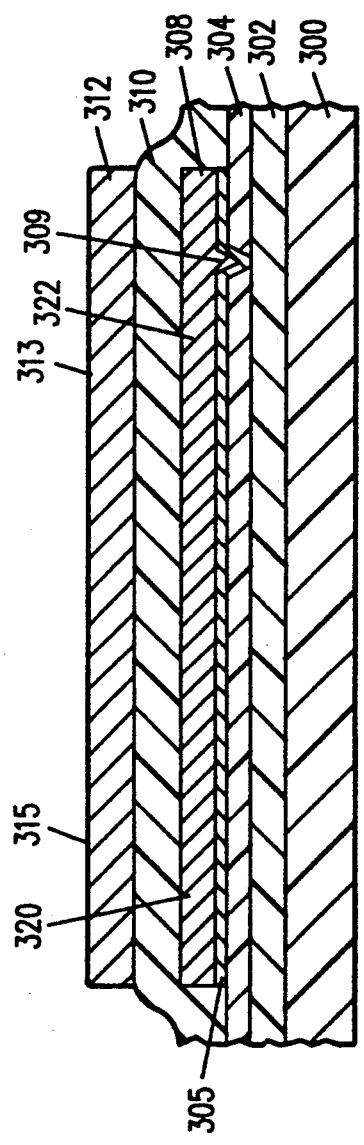
FIG. 30B is a cross-section taken on line B—B of FIG. 30A.
Figure 30:
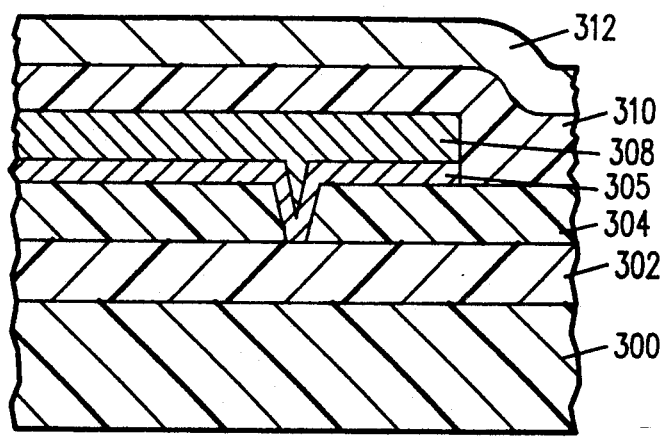
FIG. 30 is a partial cross-sectional view, similar to FIG. 29, after the step of forming of a metal layer.

Referring now to FIG. 30, there has been deposited on dielectric layer 310 second metal layer 312. Second metal layer 312 may be any conventional metal, such as tungsten, with an adhesion layer of, for example, titanium tungsten. Second metal layer 312 may be formed by any conventional metallization technique, such as by sputtering. Subsequent to deposition, second metal layer 312 is patterned. After the patterning step, second metal layer 312 has the form shown in FIGS. 30A and 30B. FIG. 30A is a top view of the structure formed according to this embodiment of the method of the invention after the step of patterning. FIG. 30B is a cross-sectional view taken along line B—B of FIG. 30A. It will be seen that a metal arm 313 is formed, which is disposed directly over arm 309 of metal layer 308. A large contact 315, from which arm 313 extends, is also defined. Contact 315 is preferably disposed directly over contact 320 and may have substantially the same shape and dimensions as contact 315.

Figure 31:
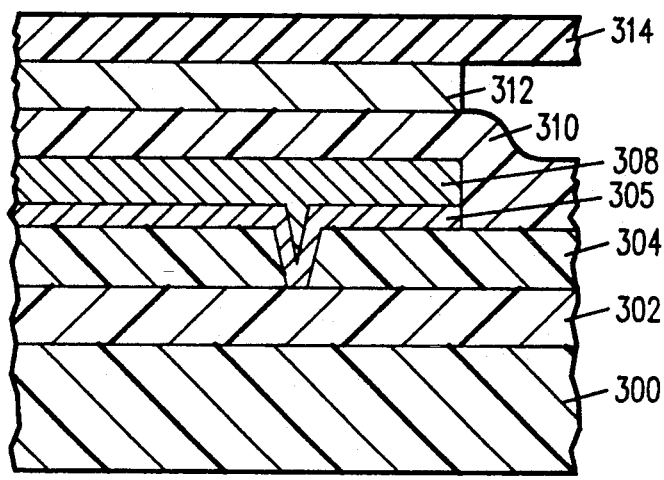
FIG. 31 is a partial cross-sectional view, similar to FIG. 30B, after the step of attaching of a second substrate.

Referring now to FIG. 31, which is a partial cross-section similar to FIG. 30B, there has been attached to patterned second metal layer 312 second substrate 314. Second substrate 314 may be made of any suitable material. For example, second substrate 314 could be a second silicon wafer. By way of further example, second substrate 314 could have a generally ring-like form. Substrate 314 is attached to metal layer 312 by techniques known in the art. For example, a standard adhesive could be used, or heat contact techniques known in the art could be employed.

Figure 31A:
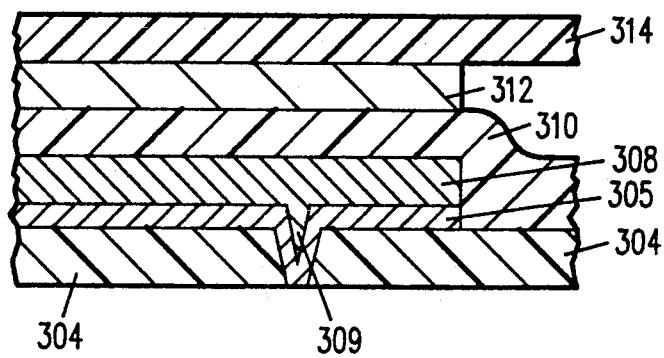
FIG. 31A is a partial cross-sectional view, after a step of removal of the release layer.

Referring now to FIG. 31A, release layer 302 has been removed by an appropriate solvent or etchant that dissolves the material comprising release layer 302, but does not substantially attack the metals of metal layers 308 and 312. As substrate 300 is no longer attached to either metal layer, substrate 300 is removed.

Figure 32:
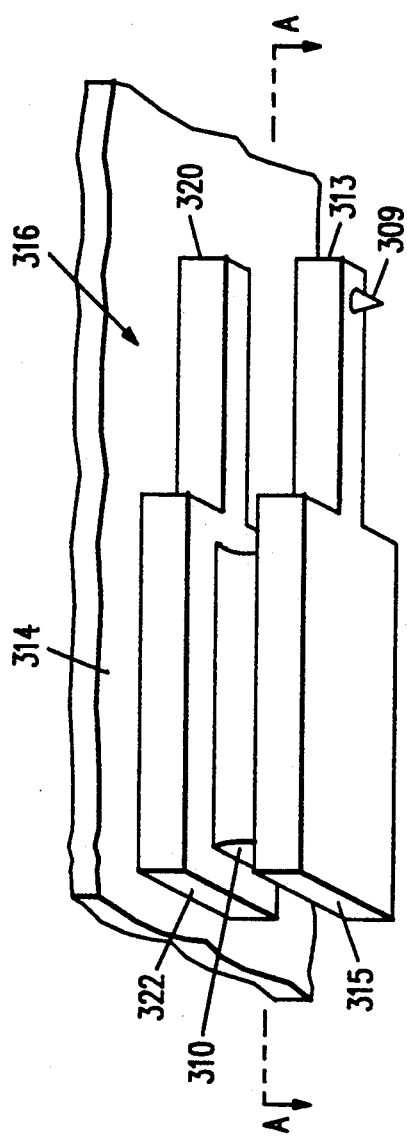
FIG. 32 is an isometric view of a completed AFM probe.
Figure 32A:
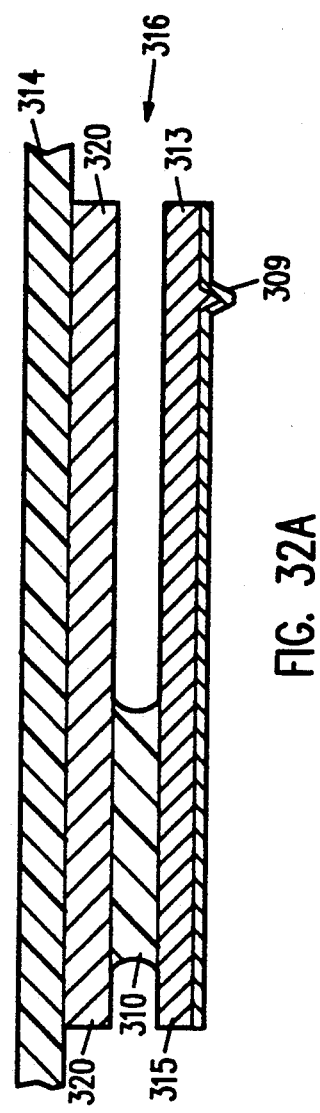
FIG. 32A is a sectional view taken along line A—A of FIG. 32.

Referring now to FIG. 32, which is a partially schematic isometric view of an AFM probe structure 316 fabricated in accordance with the method of the invention, and to FIG. 32A, which is a cross-section taken along line A—A of FIG. 32, a portion of dielectric layer 310 has been removed, preferably by use of a suitable solvent which attacks silicon dioxide but does not substantially attack the metals of first metal layer 308 and second metal layer 312. The time that the solvent is permitted to be in contact with the structure is controlled. The time is selected to be sufficiently long that dielectric 310 is entirely removed from arms 313 and 320. The time is also sufficiently short that a substantial width of dielectric 310 remains intermediate contacts 315 and 322. Dielectric layer 310 remains between contacts 315 and 322. AFM probe structure 316 includes metal arm 313, from which probe tip 309 depends. Probe tip 309 may be sharpened, by conventional chemical techniques known in the art of forming AFM and STM probes, after the step of dissolving release layer 302. Metal arm 313 depends from contact 315. Intermediate metal arm 313 and metal arm 320, there is defined a gap. Thus, dielectric layer 310 serves to support metal arm 313 a preselected distance from metal arm 320, and maintains contact 315 and contact 322 electrically isolated from one another.

In operation, appropriate leads are provided to attach contact 315 and contact 322 to a processing apparatus for an AFM (not shown). A desired capacitance is obtained between arm 313 and arm 320, by establishing the relative distance between them. Tip 309 is then brought into contact with a surface, and scanned across the surface in accordance with conventional techniques. Forces between the surface and the tip of probe 309 caused by topographical variations on the surface on the order of Angstroms force arm 313 to be deflected upward, thereby changing the distance between arm 313 and arm 320, which causes a corresponding capacitance change. The capacitance change is detected by appropriate measuring instruments.

It will be appreciated by those of skill in the art that various dimensions may be selected for an apparatus made according to the above method. By way of example only, the thickness of first metal layer may be approximately 2 microns, the thickness of dielectric layer 310 may be approximately 500 Angstroms, and the thickness of metal layer 312 may be approximately 2 microns.

Figure 33:
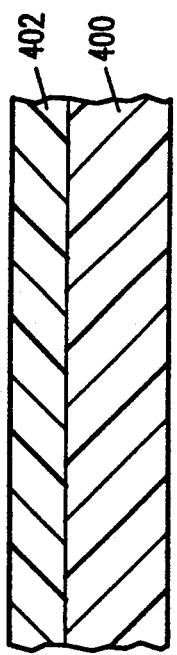
FIG. 33 is a cross-sectional view of a substrate having a release layer formed thereon according to an alternate embodiment of the invention.

There will now be described, with reference to FIGS. 33 through 41, an alternative method according to the invention of making an AFM probe assembly. Referring now to FIG. 33, there is shown substrate 400 having release layer 402 formed thereon. Substrate 400 may be, for example, a conventional single-crystal silicon substrate. As will become apparent from review of the detailed description of this embodiment of the method of the invention, the composition of substrate 400 is not important to the method of the invention.

Release layer 402 may be, for example, a resist or a high-temperature polyamite. Release layer 402 may also be, by way of further example, a metal that is attacked by an etchant or solvent that does not attack the metal of which the additional metal layers described below are formed. In general, release layer 402 may be composed of any material that can be removed, especially by a solvent or etchant, with no damage, or minimal damage, to metal layers made subsequently.

Figure 34:
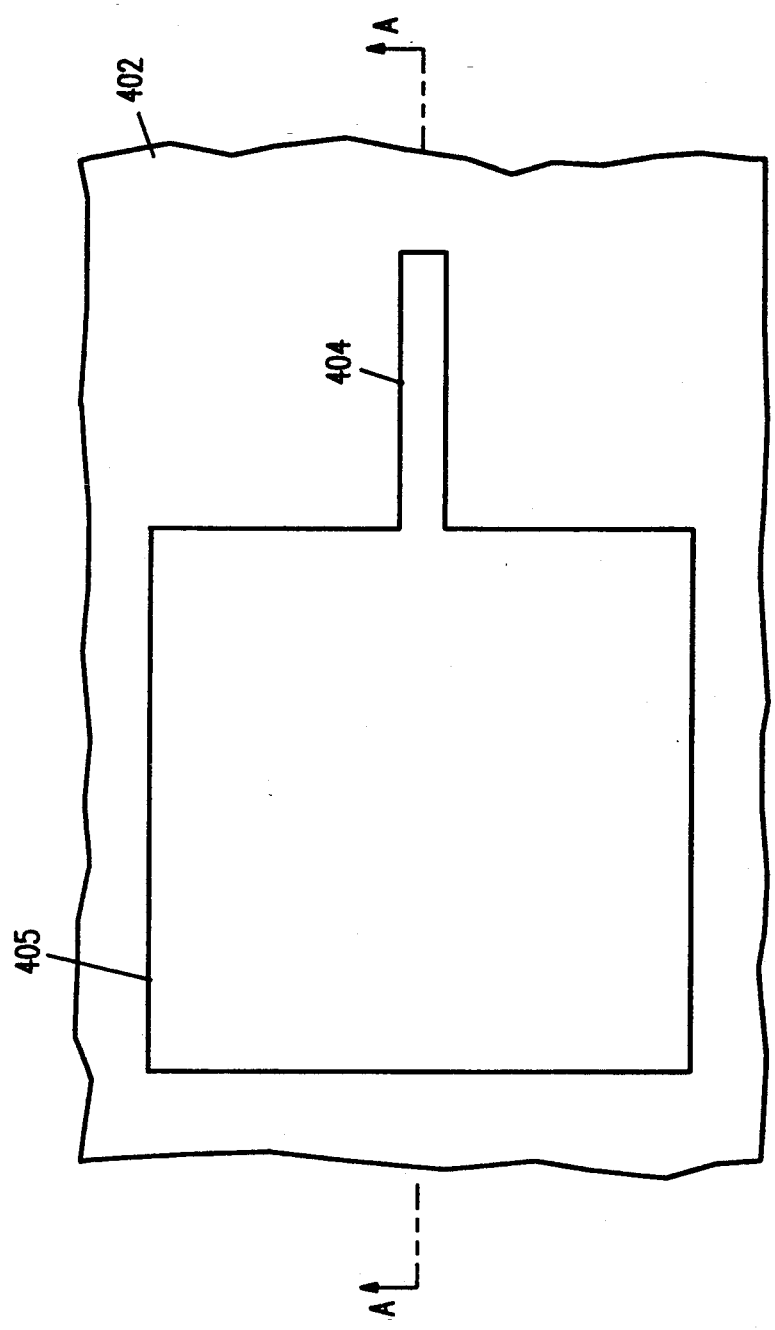
FIG. 34 is a top view of a patterned metal member disposed on a release layer.
Figure 35:
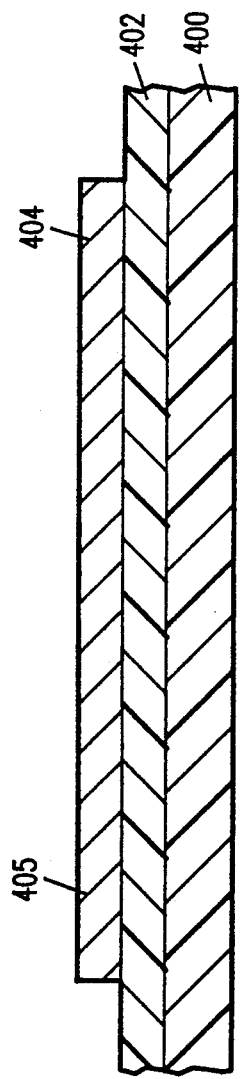
FIG. 35 is a cross-sectional view taken along line 35—35 of FIG. 34.

Referring now to FIGS. 34 and 35, there is shown metal member 404 formed on release layer 402. Metal member 404 is preferably formed by conventional metallization, patterning and etching techniques. For example, a metal layer may be deposited by chemical vapor deposition on release layer 402. A conventional resist may be applied on the deposited metal layer, which resist may be exposed and developed through conventional techniques. The resist may then be used as an etch mask in etching the metal layer to form metal member 404 with support member 405, which is substantially larger than metal member 404. Metal member 404 has a preselected, generally elongated rectangular shape with a large pad 405 attached at one end thereof. The dimensions of metal member 404 may be, by way of example, 10 micrometers wide and 50 micrometers in length.

Figure 36:
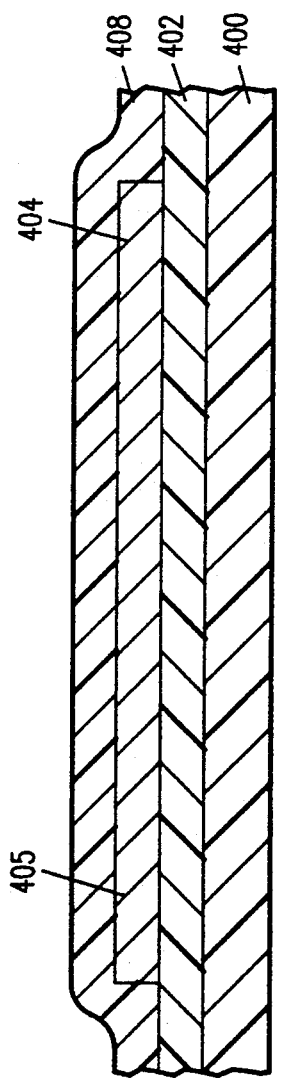
FIG. 36 is a cross-sectional view similar to FIG. 35, after the step of forming a dielectric layer.

Referring now to FIG. 36, there is shown a dielectric layer 408 formed over metal member 404, and the exposed portions of release layer 402. Dielectric layer 408 may be provided by conventional processes. In a preferred embodiment, dielectric layer 408 is composed of silicon dioxide, and is deposited by CVD techniques. In general, dielectric layer 408 may be composed of any insulating material that can be removed by a solvent or etchant that will not substantially attack metal member 404.

Figure 37A:
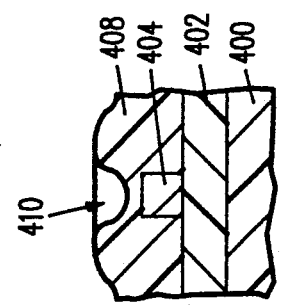
FIG. 37A is a cross-sectional view taken along line A—A of FIG. 37.
Figure 37:
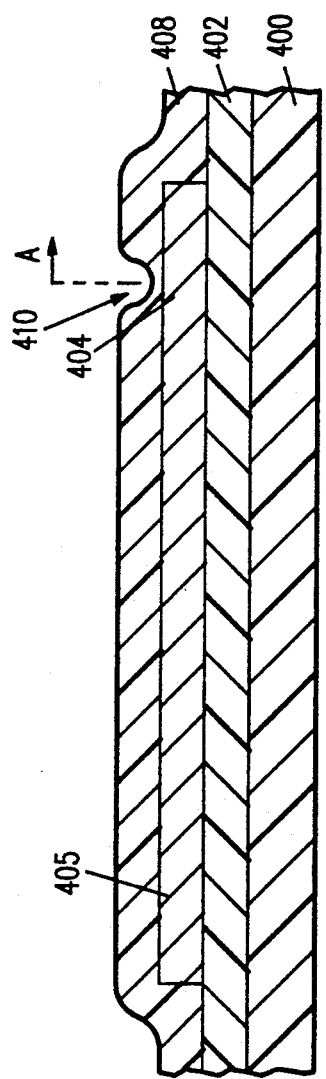
FIG. 37 is a cross-sectional view, similar to FIG. 36, after the step of forming a hole in the dielectric layer.

Referring now to FIG. 37 and FIG. 37A, there is shown a roughly conical depression 410 formed in dielectric layer 408. Depression 410 is disposed over metal member 404 at a selected position. Depression 410 does not extend downward in dielectric layer 408 to the surface of metal member 404. Thus, a thin portion of dielectric layer 408 separates the surface of depression 410 from metal member 404. Depression 410 may be formed by conventional masking and etching techniques that are well known to one of ordinary skill in the art. For example, an erodable mask may be used.

Figure 38:
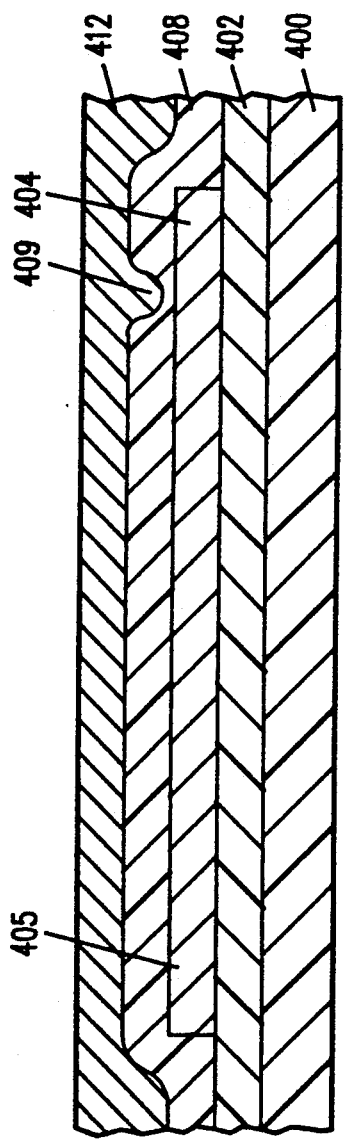
FIG. 38 is a cross-sectional view, similar to FIG. 37, after a step of providing a metal layer.

Referring now to FIG. 38, there is shown second metal layer 412 formed over dielectric layer 408. Second metal layer 412 is preferably of tungsten. Second metal layer 412 may be formed by conventional techniques. For example, a thin adhesion layer of aluminum or a titanium alloy may be formed on dielectric layer 408 by conventional techniques, such as by sputtering. Tungsten may then be deposited on the adhesion layer by conventional techniques, such as by CVD techniques. Second metal layer 412 fills depression 410 to define a metal projection 409.

Figure 39:
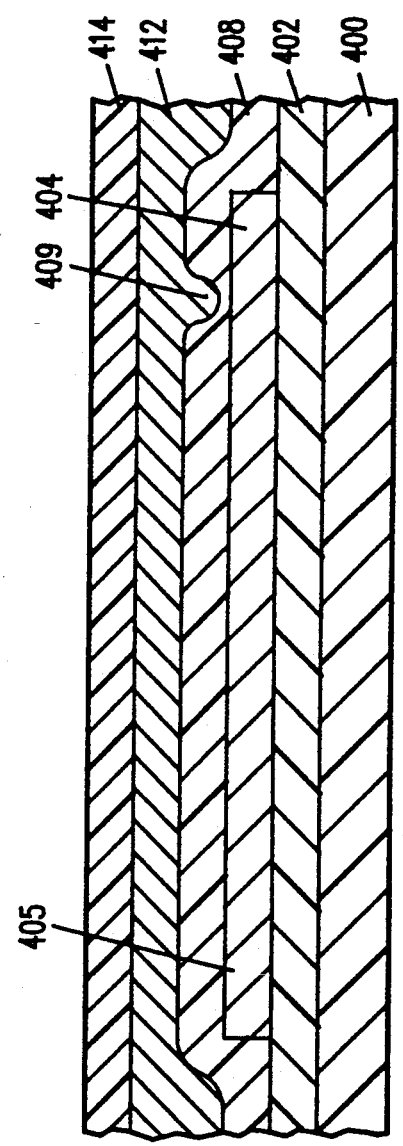
FIG. 39 is a cross-sectional view, similar to FIG. 38, after a step of attaching a second substrate.

Referring now to FIG. 39, there is shown second substrate 414 disposed on an upper surface of second metal layer 412. Second substrate 414 may be any desired material, and of any desired shape and size. For example, second substrate 414 may be a conventional single-crystal silicon wafer. Second substrate 414 may be attached to metal layer 412 either by conventional adhesives or by conventional heat contact techniques. Such techniques are well known to those of skill in the art, and will not be explained here.

Figure 40:
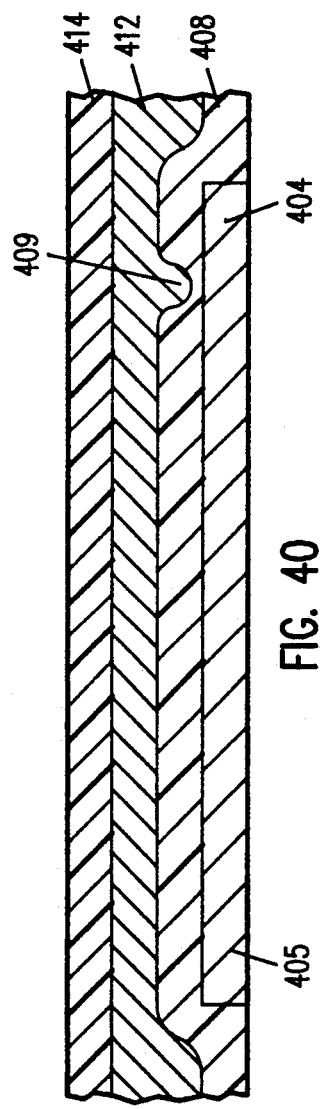
FIG. 40 is a cross-sectional view, similar to FIG. 39, after a step of removing the release layer.

Referring to FIG. 40, there is shown in cross-section a structure after a step of removal of release layer 402. Release layer 402 is removed by use of an appropriate solvent or an isotropic oxygen plasma which does not tend substantially to attack the metal layers. As the metal layers are no longer attached to substrate 400, substrate 400 is no longer shown.

Figure 41:
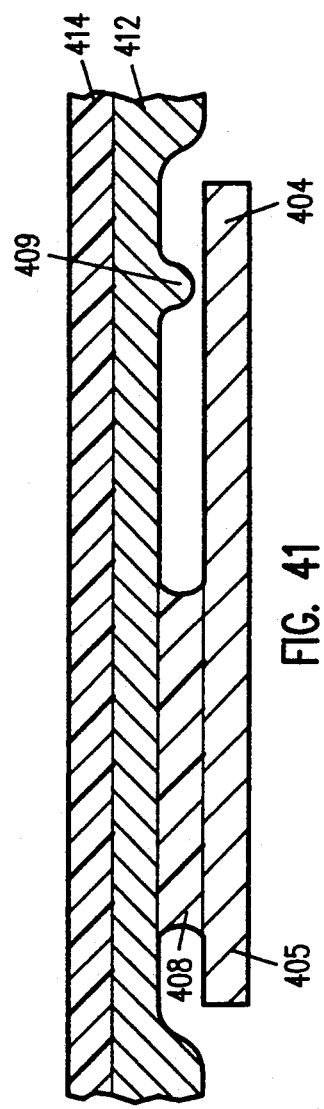
FIG. 41 is a cross-sectional view, similar to FIG. 40, after a step of partial removal of dielectric layer.

Referring now to FIG. 41, dielectric layer 408 has been partially removed. Dielectric layer 408 is partially removed by a suitable etchant or solvent. It is within the skill in the art to select an appropriate solvent or etchant that will attack the materials of which dielectric layer 408 is made, without attacking, or with only minimal attacking of, metal member 404 and pad 405, and metal layer 412. Dielectric layer 408 remains intermediate pad 405 and metal layer 412. It will thus be seen that a structure is provided, which is attached to substrate 414, and comprises metal member 404 and metal layer 412, both attached to the remaining portion of dielectric layer 408, and disposed a selected distance apart. Depression 410 has been filled with metal in the forming of metal layer 412, and thus is a tip 409.

Figure 42:
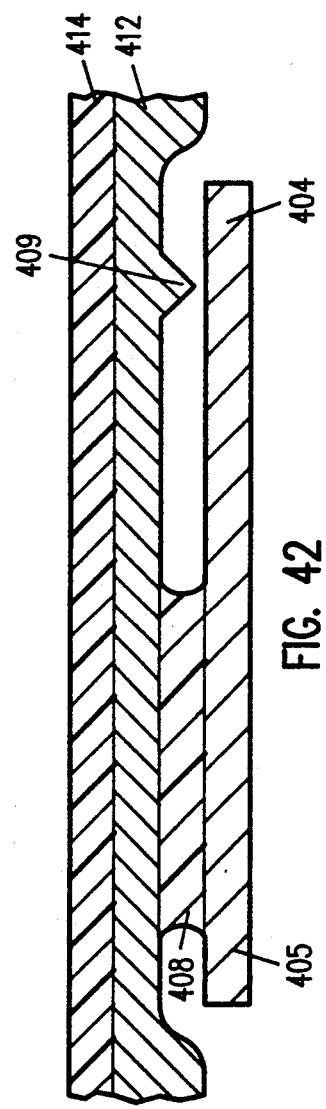
FIG. 42 is a cross-sectional view, similar to FIG. 41, of the completed AFM probe made according to the method of the invention.

Referring now to FIG. 42, there is shown the structure of FIG. 41, after the sharpening of tip 409 to provide tip 409 with a conical form having a very fine apex. Sharpening of tip 409 may be accomplished by chemical techniques that are well-known in the art. It will be seen that the structure shown in FIG. 42 may be employed as an AFM probe. Metal member 404 can be brought into contact with a surface to be scanned, and can be translated across the surface. As a result of repulsive electrostatic forces between the lower surface of metal member 404 and the object or target surface, metal member 404 will be caused to flex upward toward tip 409. By attachment to suitable AFM circuitry, a slight voltage differential may be established between metal layer 412 and metal arm 404. A tunneling current may be established between tip 416 and metal arm 404 by proper setting of the voltage differential, according to techniques well known in the art of constructing and operating an AFM. Upon deflection of metal arm 404, the tunneling current will change. Thus, the structure shown in FIG. 42 may be used as an AFM probe. Other techniques that can be used to measure deflection may also be employed.

It will be appreciated by those of skill in the art that various dimensions may be selected for an apparatus made according to the just-described method. By way of example only, the thickness of dielectric layer 408 may be about 500 Angstroms. The thickness of metal arm 404 may be about 2 microns.

It will be appreciated that there are considerable variations that can be accomplished in a method and apparatus of the invention without departing from its scope. As a result, although preferred embodiments of a method and apparatus of the invention have been described above, it is emphasized that the invention is not limited to a preferred embodiment and there exist other alternative embodiments that are fully encompassed within the invention's scope, which is intended to be limited only by the scope of the appended claims.

What is claimed is:

1. A method for alignment of a first object with a second object, comprising the steps of:
   (a) determining the location of a feature on a surface of said second object using a probe of a scanned probe microscope, said scanned probe microscope being distinct from said first object;
   (b) positioning said first object in preselected spatial relationship with respect to said located feature.

2. A method as recited in claim 1, wherein said step of positioning comprises maintaining said first object in fixed spatial relationship with respect to said probe.

3. A method as recited in claim 2, wherein said probe is rigidly mounted on a forward side of said first object.

4. A method as recited in claim 3, wherein said probe comprises a probe of a scanning tunneling microscope, said location determining means further comprising a conductor in electrical contact with said probe and extending substantially to an edge of said forward side of said first object.

5. The method of claim 3, further comprising the step of, prior to said step (a), performing metrology on the forward side of said first object to determine the relative location of a reference feature on said first object and the probe.

6. The method of claim 5, wherein said step of performing metrology comprises scanning the forward side of said first object with a scanning electron microscope.

7. A method as recited in claim 1, further comprising the steps of:
   (a) using a probe of a second scanned probe microscope in determining the location of a second feature on the surface of said second object; and
   (b) positioning said first object in preselected spatial relationship with respect to the second located feature, simultaneously with said step of positioning said first object with respect to the first located feature, thereby obtaining rotational and translational alignment of said first object to said second object.

8. A method as recited in claim 7, wherein said first probe and said second probe are rigidly attached to a forward face of said first object.

9. A method as recited in claim 8, wherein said first and second probes comprise probes of scanning tunneling microscopes.

10. A method for alignment of a first object with a second object, comprising the steps of:
(a) determining the location of a first feature on a surface of said second object using a probe of a scanned probe microscope; and
(b) determining the location of a first feature on the surface of said first object, and
(c) positioning said first object in preselected spatial relationship with respect to said located first feature on said second object.

11. A method as recited in claim 10, wherein said step of determining the location of a feature on a surface of said first object comprises employing a probe of a scanned probe microscope.

12. A method as recited in claim 11, wherein said probe comprises a probe of an atomic force microscope.

13. A method as recited in claim 10, further comprising the steps of:
(a) determining the location of a second feature on the surface of said second object using a probe of a scanned probe microscope; and
(b) positioning said first object in preselected spatial relationship with respect to the second located feature, simultaneously with said step of positioning said first object, thereby obtaining rotational and translational alignment of said first object to said second object.

14. A method as recited in claim 13, wherein said step of positioning further comprises using a probe of a third scanned probe microscope in determining the location of a second feature on a surface of said first object.

15. In the apparatus for performing optical lithography on a substrate, having an optical mask and a mask holder supporting the optical mask, the improvement comprising means, comprising a probe of a first scanned probe microscope, for determining the location of a feature on a surface of the substrate, further comprising a probe of a second scanned probe microscope, in known spatial relationship with respect to said probe of said first scanned probe microscope, for determining the location of a feature on said mask.

16. The improvement of claim 15, wherein said probe of said first scanned probe microscope and said probe of said second scanned probe microscope each depends from said holder.

17. A method for rotational and translational alignment of a first object with a second object, comprising the steps of:
(a) determining, employing one and only one probe of a scanned probe microscope, the position and orientation on the surface of the second object of an alignment mark having a shape such that its position and orientation can be determined;
(b) comparing the determined position and orientation of the alignment mark with a stored position and orientation of the alignment mark; and
(c) translating and rotating said second object relative to said first object to align said first object with said second object.

18. The method of claim 17, wherein said probe is mounted on a surface of said first object.

19. The method of claim 17, wherein said first object is a mask.

20. The method of claim 17, wherein said second object is a wafer.

21. An apparatus for rotational and translational alignment of a first object with a second object, comprising:
(a) means, comprising one and only one probe of a scanned probe microscope, for determining the position and orientation on the surface of the second object of an alignment mark having a shape such that its orientation can be determined;
(b) data processing apparatus adapted to compare the determined position and orientation of the alignment mark with a stored position and orientation of the alignment mark; and
(c) means for translating and rotating said second object relative to said first object to align said first object with said second object.

22. The apparatus of claim 21, wherein said probe is mounted on a surface of said first object.

23. The apparatus of claim 21, wherein said first object is a mask.

24. The apparatus of claim 21, wherein said second object is a wafer.

25. A method for detecting misalignment between a first object and a second object, comprising the steps of:
(a) scanning the surface of the second object using a probe of a scanned probe microscope until sufficient information is obtained regarding the scanned portion of the surface such that the scanned portion can be identified on a stored reference image of the surface whereby the position of said probe can be determined; and
(b) comparing the determined position of the probe on the surface to a predetermined home position for the probe on the reference image.

26. The method of claim 25 wherein the second object is a mask, and the first object is a mask holder.

27. An apparatus for detecting misalignment between a first object and a second object, comprising:
(a) means, comprising a probe of a scanned probe microscope, for obtaining an image of a portion of the surface of the second object; and
(b) means for comparing the obtained image of the surface of the second object with a stored reference image, in order to determine the location of the probe on the surface relative to a predetermined home position for said probe.

28. The apparatus of claim 27, wherein said second object is a mask, and said first object is a mask holder.

* * * * *